United States Patent
Kim et al.

(10) Patent No.: US 9,129,702 B2
(45) Date of Patent: Sep. 8, 2015

(54) METHOD OF REFRESHING VOLATILE MEMORY DEVICE

(71) Applicant: SAMSUNG ELECTRONICS CO., LTD., Suwon-Si, Gyeonggi-Do (KR)

(72) Inventors: Dae-Jeong Kim, Seoul (KR); Heon Lee, Hwaseong-Si (KR); Hoon-Chang Yang, Seoul (KR); Kwang-Woo Lee, Suwon-Si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/336,337

(22) Filed: Jul. 21, 2014

(65) Prior Publication Data

US 2015/0043295 A1      Feb. 12, 2015

(30) Foreign Application Priority Data

Aug. 6, 2013    (KR) .................. 10-2013-0093342

(51) Int. Cl.
*G11C 7/00*      (2006.01)
*G11C 11/406*    (2006.01)
*G11C 29/02*     (2006.01)

(52) U.S. Cl.
CPC ........ *G11C 11/406* (2013.01); *G11C 11/40615* (2013.01); *G11C 11/40618* (2013.01); *G11C 11/40622* (2013.01); *G11C 29/02* (2013.01); *G11C 2211/4065* (2013.01); *G11C 2211/4068* (2013.01)

(58) Field of Classification Search
CPC ........... G11C 11/406; G11C 11/40615; G11C 11/40618; G11C 8/06; G11C 29/02; G11C 8/10; G11C 29/04; G11C 7/1006
USPC ............... 365/222, 189.02, 230.06, 236
See application file for complete search history.

(56) References Cited

U.S. PATENT DOCUMENTS

| | | | |
|---|---|---|---|
| 5,515,331 A | 5/1996 | Kim | |
| 5,623,451 A | 4/1997 | Kawagoe | |
| 5,875,143 A | 2/1999 | Ben-Zvi | |
| 7,269,085 B2 | 9/2007 | Sohn et al. | |
| 7,630,268 B2 | 12/2009 | Eto | |
| 8,363,496 B2* | 1/2013 | Hayashi et al. | 365/222 |
| 8,391,100 B2 | 3/2013 | An et al. | |
| 2012/0300568 A1 | 11/2012 | Park et al. | |

FOREIGN PATENT DOCUMENTS

| | | |
|---|---|---|
| JP | 05-128849 | 5/1993 |
| JP | 3145692 | 1/2001 |
| KR | 1020010027372 A | 4/2001 |
| KR | 1020040022857 A | 3/2004 |

* cited by examiner

Primary Examiner — David Lam
(74) Attorney, Agent, or Firm — Volentine & Whitt, PLLC

(57) ABSTRACT

A method is provided for refreshing a volatile memory. The method includes storing address information about a weak cell row address that is to be refreshed according to a weak cell refresh period that is shorter than a refresh period, performing a counting operation for generating a refresh row address, comparing the refresh row address with the address information, refreshing the weak cell row address when a result of the comparison shows that the refresh row address and the weak cell row address of the address information coincide with each other, changing the weak cell row address by changing a pointer of the address information, and refreshing the changed weak cell row address according to the weak cell refresh period.

20 Claims, 17 Drawing Sheets

METHOD OF REFRESHING VOLATILE MEMORY DEVICE

CROSS-REFERENCE TO RELATED APPLICATION

A claim for priority under 35 U.S.C. §119 is made to Korean Patent Application No. 10-2013-0093342, filed on Aug. 6, 2013, in the Korean Intellectual Property Office, the entire contents of which are hereby incorporated by reference.

BACKGROUND

A volatile memory device, such as a dynamic random access memory (DRAM) device, performs refresh operations for maintaining stored data. A refresh period may be defined by SPEC (specification). When a DRAM memory cell has a data retention time that is shorter than the refresh period defined by SPEC (e.g., a weak cell), the weak cell may be with a redundancy cell. Thus, a refresh method capable of reducing the number of redundancy cells and improving a repair ratio by the refresh leveraging is needed.

SUMMARY

Embodiments of the inventive concept provide methods of refreshing a volatile memory device for improving refresh leveraging efficiency.

According to an aspect of the inventive concept, there is provided a method of refreshing a volatile memory. The method includes storing address information about a weak cell row address that is to be refreshed according to a weak cell refresh period that is shorter than a refresh period, performing a counting operation for generating a refresh row address, comparing the refresh row address with the address information, refreshing the weak cell row address when a result of the comparison shows that the refresh row address and the weak cell row address of the address information coincide with each other, changing the weak cell row address by changing a pointer of the address information; and refreshing the changed weak cell row address according to the weak cell refresh period.

Performing the counting operation may include initializing the refresh row address, incrementally increasing the refresh row address, and initializing the refresh row address when the refresh row address is greater than a maximum row address. The refresh row address may be initialized in response to a reset signal that is generated after finishing a power-up sequence of the volatile memory or finishing a power-down mode.

Performing the counting operation may include outputting the refresh row address, incrementally increasing the refresh row address, and initializing the refresh row address when the refresh row address is greater than a maximum row address.

The weak cell row address of the address information may be an address of a weak cell row including at least one cell having a data retention time that is shorter than the refresh period that is defined as a standard.

The address information may be stored in an address storing unit before packaging the volatile memory device. Or, the address information may be stored in an address storing unit after packaging the volatile memory device.

According to another aspect of the inventive concept, there is provided a method of refreshing a volatile memory. The method includes storing address information about a weak cell row address that is to be refreshed according to a weak cell refresh period that is shorter than a refresh period, performing a counting operation for generating a refresh row address, comparing the refresh row address with the address information, skipping a refresh of the weak cell row address when a result of the comparison shows that the refresh row address and the address information the weak cell row address coincide with each other, and refreshing the weak cell row address of the address information according to the weak cell refresh period.

The weak cell row address of the address information may not be refreshed with the refresh period.

According to another aspect of the inventive concept, a volatile memory device includes a memory cell array having multiple memory cell rows, and a refresh address generator configured to output refresh row addresses for identifying rows of the memory cell array to be refreshed according to a refresh period of a refresh operation. The refresh address generator includes an address storing unit configured to store address information about weak cell row addresses to be sequentially refreshed according to according to a weak cell refresh period of a refresh leveraging operation, each weak cell row including at least one cell having a data retention time shorter than the refresh period, and the weak cell refresh period being shorter than the refresh period; a refresh counter configured to incrementally increase a refresh row address; a comparing unit configured to compare the refresh row address output by the refresh counter with the address information read from the address storing unit, and to generate a match signal when the refresh row address coincides with a weak cell row address of the address information; and an address changing unit configured to receive the match signal from the comparing unit, and to generate an address change signal provided to the address storing unit, the address storing unit changing the weak cell row address of the address information. The changed weak cell row address is refreshed according to the weak cell refresh period of the refresh leveraging operation.

The address storing unit may be further configured to change the weak cell row address by increasing a pointer of the address information by one.

The volatile memory device may further include control logic configured to control operation of the refresh address generator. The control logic may compares the refresh row address to a maximum row address of the memory cell rows included in the memory cell array, and when the refresh row address is not greater than the maximum row address, the refresh counter again may increase the refresh row address by one. When the refresh row address is greater than the maximum row address, the refresh counter may reset the refresh row address to a first refresh row address.

BRIEF DESCRIPTION OF THE DRAWINGS

Illustrative, non-limiting embodiments will be more clearly understood from the following detailed description taken in conjunction with the accompanying drawings, in which.

DETAILED DESCRIPTION OF THE EMBODIMENTS

Figure 1:
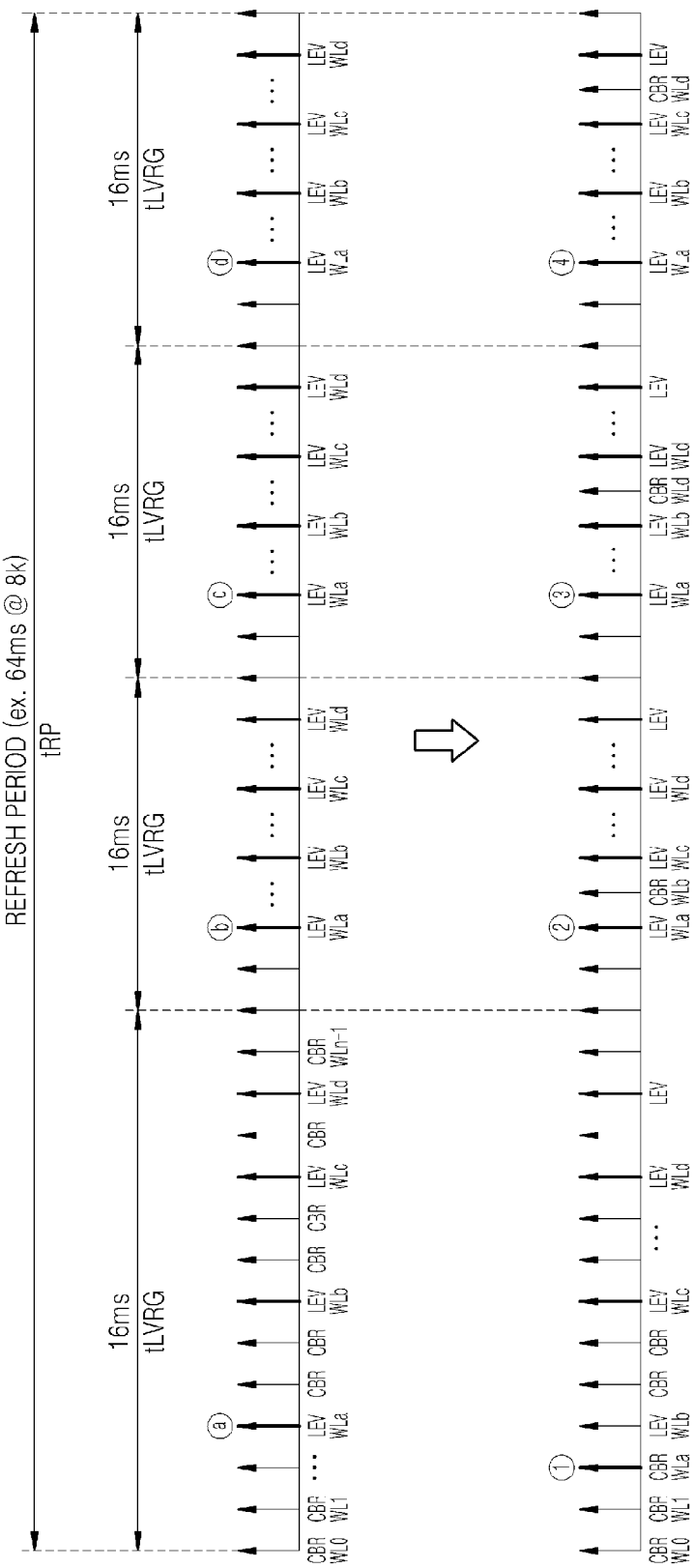
FIG. 1 is a diagram illustrating a refresh method of a volatile memory, according to an embodiment of the inventive concept.

Various exemplary embodiments will be described in particular with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. That is, the embodiments are not intended to limit the inventive concept to particular modes of practice, and it is to be appreciated that all changes, equivalents, and substitutes that do not depart from the spirit and technical scope of the inventive concept are encompassed in the inventive concept. Sizes of structures may be greater or less than the actual structures for clarity. Also, unless otherwise noted, like reference numerals refer to like elements throughout the attached drawings and written description, and thus descriptions will not be repeated.

The terminology used herein is for the purpose of describing particular embodiments only and is not intended to be limiting of exemplary embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, components, or combinations thereof but do not preclude the presence or addition of one or more other features, integers, steps, operations, elements, components, or combinations thereof.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Expressions such as "at least one of," when preceding a list of elements, modify the entire list of elements and do not modify the individual elements of the list.

The storage capacity of a semiconductor memory device, such as dynamic random access memory (DRAM), has finite data retention, which has continued to be scaled down. Generally, the capacitance value of a cell capacitor has decreased and bit error rate (BER) has increased, thereby reducing reliability of data stored in a memory cell. To prevent this, DRAM periodically performs a refresh operation in order to maintain data stored in a memory cell. The refresh operation may be performed according to a refresh period defined by specification (DRAM SPEC).

Among the memory cells, some memory cells have data retention times shorter than the refresh period (referred to weak cells). Generally, the number of memory cells having data retention times shorter than the refresh period defined in the DRAM SPEC is increasing. If such weak cells are replaced with redundancy cells in order to repair the weak cells, the number of redundancy cells increases, which may cause a problem with chip size overhead. Instead of replacing the weak cells with the redundancy cells, the weak cells may be repaired by refreshing the weak cells having the short data retention times according to a weak cell refresh period that is shorter than a refresh period, e.g., defined in the DRAM standard. Such a refresh operation is referred to as refresh leveraging.

The refresh leveraging operation is set to refresh weak cell rows in the middle of a normal refresh operation for refreshing memory cell rows according to a refresh period. During the refresh period, the normal refresh operation refreshes each of the memory cell rows sequentially, one by one, and the refresh leveraging operation refreshes the weak cell rows from among the memory cell rows according to a refresh leveraging cycle. Embodiments of the inventive concept effectively ensure a refresh operation that improves refresh leveraging efficiency for repairing the weak cell rows.

FIG. 1 is a diagram illustrating a method of refreshing a volatile memory device, according to embodiments of the inventive concept. According to the standard for volatile memory devices, a refresh operation for refreshing 8K memory cell rows for 64 ms or a refresh operation for refreshing 4K memory cell rows for 32 ms is regulated.

Referring to FIG. 1, the refresh operation for refreshing the 8K memory cell rows for 64 ms, regulated by the standard of the volatile memory device, for example, will be described below. The refresh operation may include an auto refresh operation and a self refresh operation. The auto refresh operation generates a refresh row address in response to a refresh command (REF) that is regularly applied, and refreshes a memory cell row corresponding to the refresh row address. The self refresh operation enters a self refresh mode in response to a self refresh enter command (SRE) and regularly refreshes the memory cell rows using a built-in timer in the self refresh mode.

The refresh operation includes a normal refresh operation for refreshing each of the memory cells rows sequentially (one-by-one) and a refresh leveraging operation (LEV) for refreshing weak cell rows. The normal refresh operation may be referred to as a column select (CAS) before row select (RAS) refresh operation, or CAS before RAS (CBR) refresh. According to the CBR refresh, a refresh row address is generated by a counter in the volatile memory device whenever there is a refresh request, without input of row address from outside.

During 64 ms of the normal refresh operation (CBR) for 8K memory cells, the refresh leveraging operation (LEV) of the weak cell rows may be set to be performed within 16 ms, for example. Accordingly, four refresh leveraging cycles (tLVRG) of 16 ms may be included in 64 ms.

According to the normal refresh operation (CBR), when a refresh counter is initialized and the CBR refresh row address is reset as "0", a memory cell row corresponding to the CBR refresh row address 0 is refreshed. The memory cell row is a row of memory cells connected to one word line WL. For convenience of explanation, the minimum memory cell row corresponding to the CBR refresh row address 0 is referred to as "WL0", and a memory cell row corresponding to the CBR refresh row address increased by 1 by the refresh count is referred to as "WL1".

During the refresh period (tRP) of the normal refresh operation (CBR), memory cell rows WL0, WL1, . . . , WLn−1, and WLn are sequentially refreshed. The maximum memory cell row is refreshed last.

Figure 2:
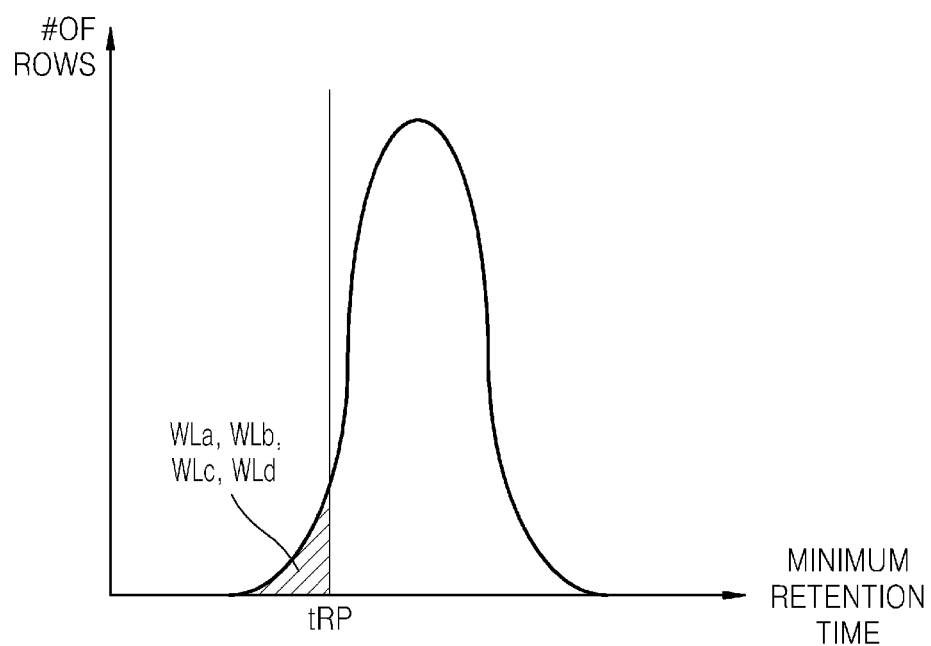
FIG. 2 is a diagram showing a distribution of memory cell rows, according to data retention time of a memory cell.

The refresh leveraging operation (LEV) refreshes weak cell rows within the refresh leveraging cycle (tVLRG) of 16 ms. For purposes of illustration, it is assumed that the weak cell rows are WLa, WLb, WLc, and WLd. The weak cell rows WLa, WLb, WLc, and WLd are cells having data retention times shorter than the refresh period (tRP) defined in the standard, as shown in FIG. 2. In the present embodiment, four weak cell rows are described for convenience of description; however, the refresh leveraging may be performed with respect to any variety of numbers of weak cell rows. The number of weak cell rows that are refresh leveraged may be referred to as refresh leveraging resources. In the present embodiment, there are three refresh leveraging resources. Refresh leveraging resources may be set as, 512.

During first refresh leveraging cycle (tLVRG) of 16 ms, the refresh operation may include the refresh leveraging operations (LEV) with respect to the weak cell rows WLa, WLb, WLc, and WLd between the sequential CBR refresh of the memory cell rows WL0, WL1, . . . , WLn−1. During second refresh leveraging cycle (tLVRG) of 16 ms, the refresh operation may include the refresh leveraging operations (LEV) with respect to the weak cell rows WLa, WLb, WLc, and WLd between the sequential CBR refresh of the memory cell rows WL0, WL1, . . . , WLn−1. Likewise, during third and fourth refresh leveraging cycles (tLVRG) of 16 ms, the refresh operation may include the refresh leveraging operations (LEV) with respect to the weak cell rows WLa, WLb, WLc, and WLd between the sequential CBR refresh of the memory cell rows WL0, WL1, . . . , WLn−1. Accordingly, the number of times of refresh leveraging with respect to the weak cell row WLa, for example, may be set as four times (ⓐⓑⓒⓓ).

The memory cell rows WL0, WL1, . . . WLn−1, and the weak cell rows WLa, WLb, WLc, and WLd may be provided by a refresh address generator. The memory cell rows WL0, WL1, . . . , WLn−1 correspond to the CBR refresh row addresses that are incrementally generated by a refresh counter in the refresh address generator, and the weak cell rows WLa, WLb, WLc, and WLd correspond to address information provided by an address storage in the refresh address generator.

In an operation of performing CBR refresh of the CBR refresh row address that is incrementally increased, the CBR refresh row address may coincide with a weak cell row of the address information stored in the address storage. After that, during the refresh leveraging operation (LEV) timing, the weak cell row corresponding to the address information stored in the address storage may be refreshed once more. That is, the weak cell row corresponding to the address information stored in the address storage may be refreshed twice (double refreshed) in the refresh leveraging cycle of 16 ms. Accordingly, the repair efficiency of the refresh leverage resources may be degraded.

To solve this problem, it may be changed so that, when a weak cell row address is CBR refreshed, a next weak cell row address is refresh-leveraged during the refresh leveraging cycle of 16 ms. For example, in the first refresh leveraging cycle, after initiating the refresh counter, the memory cell rows WL0, WL1, . . . are sequentially refreshed (CBR) according to the CBR refresh row addresses generated by the refresh counter. When the CBR refresh row address (for example, WLa) is compared with the address information of a weak cell row (for example, WLa), it is determined that the CBR refresh row address (WLa) coincides with the address information of the weak cell row (WLa), and the corresponding CBR refresh row address is refreshed (①). Since the weak cell row WLa, which has to undergo the refresh leveraging operation (LEV), has now been CBR refreshed (①), it may be changed so that the next weak cell row WLb is refreshed according to the refresh leveraging operation (LEV). Also, since the weak cell row WLa has been CBR refreshed (①), the number of times for performing the refresh leveraging operation (LEV) with respect to the weak cell WLa is set to three (②③④).

In this regard, when the weak cell row WLb, which has to undergo the refresh leveraging operation (LEV) in the second refresh leveraging cycle, is CBR refreshed, it may be changed so that the next weak cell row WLc is refreshed in the refresh leveraging operation (LEV). When the weak cell row WLc, which has to undergo the refresh leveraging in the third refresh leveraging cycle, is CBR refreshed, it may be changed so that the next weak cell row WLd is refreshed in the refresh leveraging operation (LEV). When the weak cell row WLd, which has to undergo the refresh leveraging in the fourth refresh leveraging cycle, is CBR refreshed, it may be changed so that the next weak cell row is refreshed in the refresh leveraging operation (LEV). In the present embodiment, one weak cell row is CBR refreshed in each of the refresh leveraging cycles (tLVRG); however, various numbers of weak cell rows may be CBR refreshed in each of the refresh leveraging cycles, without departing from the scope of the present teachings.

Figure 3:
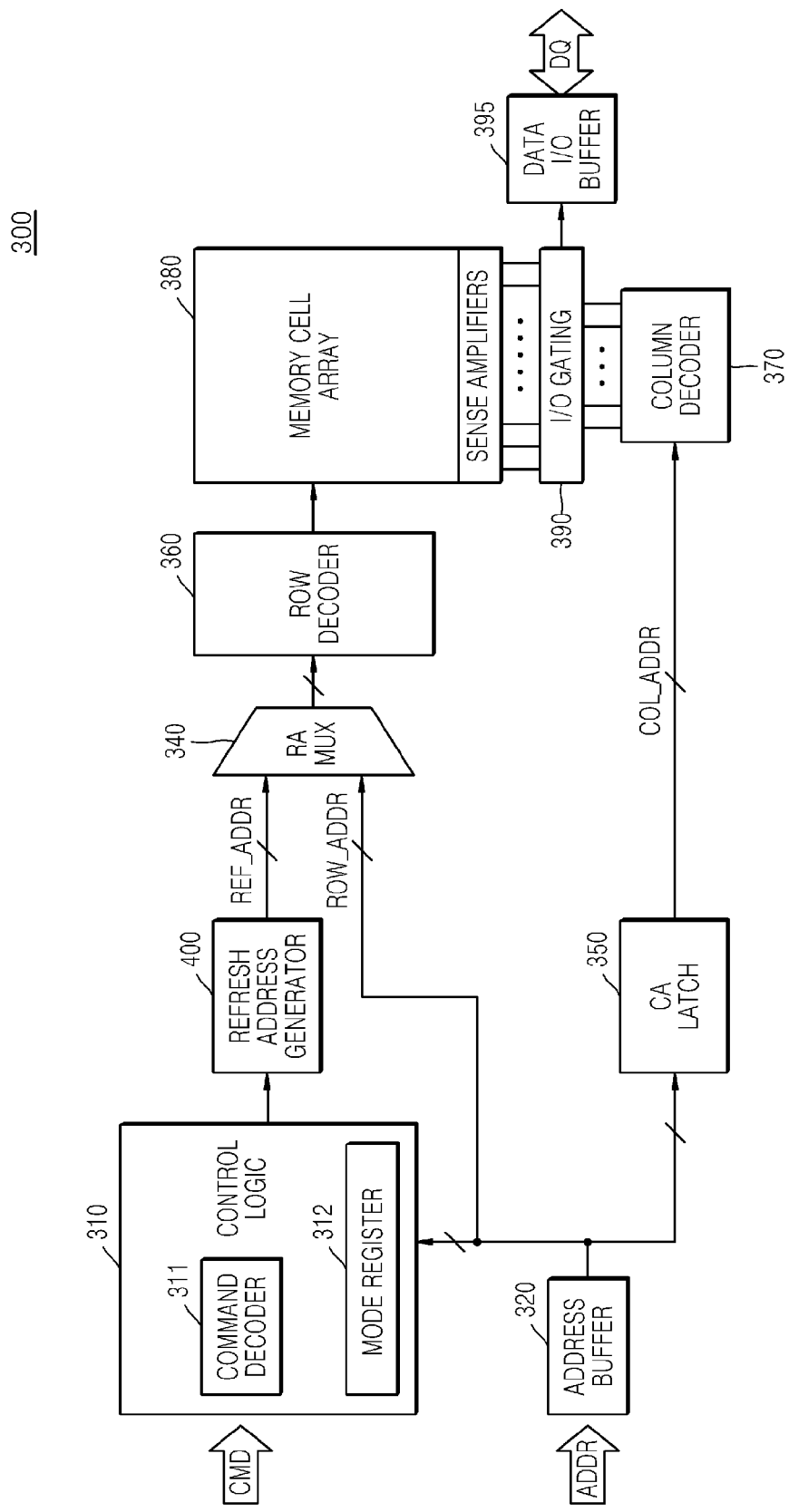
FIG. 3 is a block diagram of a volatile memory device configured to perform a refresh method, according to embodiments of the inventive concept.

FIG. 3 is a block diagram showing a volatile memory device 300 configured to perform a refresh method, according to embodiments of the inventive concept.

Referring to FIG. 3, the volatile memory device 300 includes control logic 310, an address buffer 320, a row address multiplexer 340, a column address latch 350, a row decoder 360, a column decoder 370, a memory cell array 380, an input/output gate circuit 390, and a refresh address generator 400.

The volatile memory device 300 may be a dynamic random access memory (DRAM), such as Double Data Rate (DDR) Synchronous Dynamic Random Access Memory (SDRAM), Low Power Double Data Rate (LPDDR) SDRAM, Graphics Double Data Rate (GDDR) SDRAM, or Rambus Dynamic Random Access Memory (RDRAM), or any other volatile memory device that needs a refresh operation.

The control logic 310 controls operations of the volatile memory device 300. For example, the control logic 310 may generate control signals so that the volatile memory device 300 performs a writing operation or a reading operation. The control logic 310 includes a command decoder 311 for decoding a command CMD transmitted from a memory controller (not shown), and a mode register 312 for setting an operation mode of the volatile memory device 300. For example, the command decoder 311 may generate control signals corresponding to the commands CMD by decoding a writing enable signal (/WE), a row address strobe signal (/RAS), a column address strobe signal (/CAS), a chip selection signal (/CS), and the like.

The control logic 310 may further receive a clock signal CLK and a clock enable signal CKE for driving the volatile memory device 300 in synchronization. The control logic 310 controls the refresh address generator 400 to perform an auto refresh operation in response to a refresh command (REF) or controls the refresh address generator 400 to perform a self refresh operation in response to a self refresh enter command (SRE).

The address buffer 320 receives addresses (ADDR) including a row address ROW_ADDR and a column address COL_ADDR from the memory controller. Also, the address buffer 320 may further receive a bank address when the memory cell array 380 includes a plurality of bank arrays. The address buffer 320 provides the row address multiplexer 340 with the received row address ROW_ADDR, provides the column address latch 350 with the received column address COL_ADDR, and provides bank control logic (not shown) with the received bank address. The bank control logic may generate bank control signals in response to the bank address. In response to the bank control signals, a bank row decoder and a bank column decoder connected to the bank array corresponding to the bank address may be activated.

The row address multiplexer 340 receives the row address ROW_ADDR from the address buffer 320, and receives a refresh row address REF_ADDR from the refresh address generator 400. The row address multiplexer 340 may selectively output the row address ROW_ADDR or the refresh row address REF_ADDR. The row address ROW_ADDR output from the row address multiplexer 340 is applied to the row decoder 360.

The row decoder 360 decodes the row address ROW_ADDR output from the row address multiplexer 340 to activate a word line corresponding to the row address ROW_ADDR. For example, the row decoder 360 may apply a word line driving voltage to the word line corresponding to the row address ROW_ADDR.

The column address latch 350 receives the column address COL_ADDR from the address buffer 320, and temporarily stores the received column address COL_ADDR. The column address latch 350 may incrementally increase the received column address COL_ADDR in a burst mode, for example. The column address latch 350 applies the column address COL_ADDR that is temporarily stored or incrementally increased to the column decoder 370. The column decoder 370 activates a sense amplifier corresponding to the column address COL_ADDR via the input/output gate circuit 390.

The input/output gate circuit 390 may include circuits for gating input/output data. Additionally, the input/output gate circuit 390 may include input data mask logic, read data latches for storing data output from the memory cell array 380, and a writing driver for writing data (DQ) in the memory cell array 380.

The data DQ that will be read from the memory cell array 380 is sensed and amplified by the sense amplifiers, and may be stored in the read data latches of the input/output gate circuit 390. The data DQ stored in the read data latches may be provided to the memory controller via a data input/output buffer 395. The data DQ that will be written in the memory cell array 380 may be provided by the memory controller to the data input/output buffer 395. The data DQ provided to the data input/output buffer 395 may be written in the memory cell array 380 via a writing driver.

The refresh address generator 400 is configured to generate a CBR refresh row address, and compare the CBR refresh row address with address information of weak cell rows that will undergo a refresh leveraging operation. When the CBR refresh row address corresponds to the address information of a weak cell row, the refresh address generator 400 generates the corresponding CBR refresh row address as a refresh address REF_ADDR. The refresh address generator 400 than changes so that a next weak cell row is refresh-leveraged in the refresh leveraging operation, since the current weak cell row, which has to undergo the refresh leveraging, is CBR refreshed.

Figure 4:
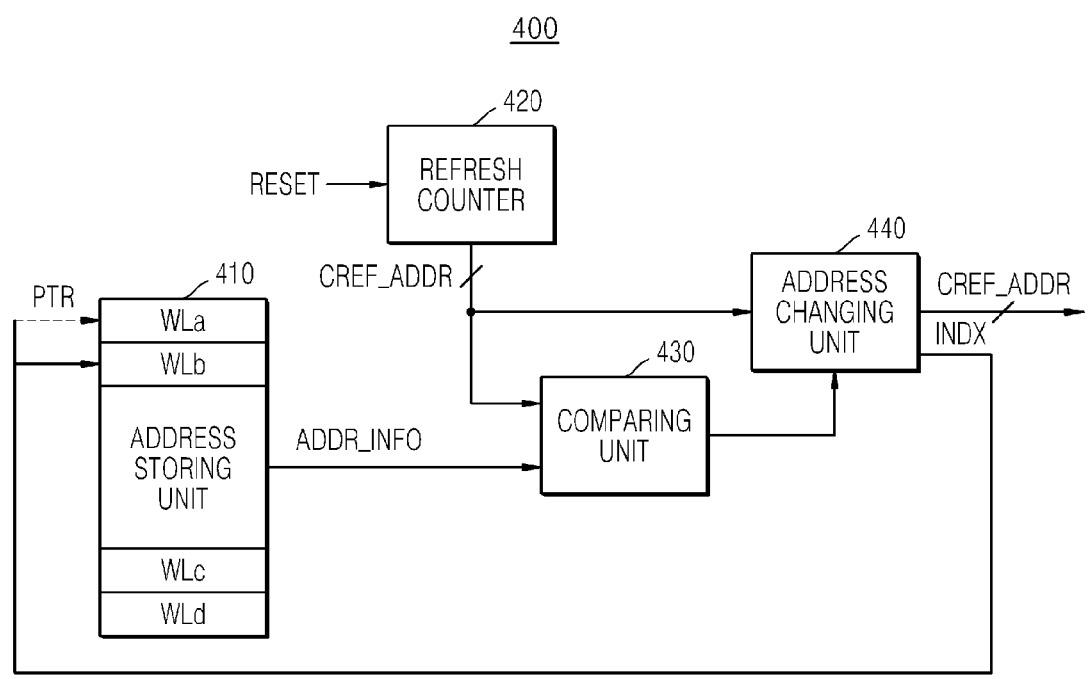
FIG. 4 is a diagram illustrating the refresh address generator of FIG. 3, according to embodiments of the inventive concept.

FIG. 4 is a block diagram illustrating the refresh address generator 400 of FIG. 3, according to embodiments of the inventive concept.

Referring to FIG. 4, the refresh address generator 400 includes an address storing unit 410, a refresh counter 420, a comparing unit 430, and an address changing unit 440.

The address storing unit 410 includes address information ADDR_INFO regarding one or more weak cell rows WLa, WLb, WLc, and/or WLd. The number of sets of the address information ADDR_INFO stored in the address storing unit 410 corresponds to the number of weak cell rows included in the memory cell array 380 (see FIG. 3). The number of sets of the address information ADDR_INFO stored in the address storing unit 410 may be referred as a refresh leveraging resources. The sets of the address information ADDR_INFO stored in the address storing unit 410 may be sequentially refreshed at the times of the refresh leveraging operations (LEV) during the refresh operation, according to an order designated by a pointer PTR. The address storing unit 410 of the present embodiment stores the representative weak cell rows WLa, WLb, WLc, and WLd, which are refreshed in the order of WLa, WLb, WLc, and WLd in the refresh leveraging operations (LEV).

The address information ADDR_INFO may be stored in the address storing unit 410 before packing the volatile memory device 300. Alternatively, the address information ADDR_INFO may be stored in the address storing unit 410 after packing the volatile memory device 300. The address storing unit 410 may be formed by various types of non-volatile memory devices, such as an electric programmable fuse memory, a laser-programmable fuse memory, an anti-fuse memory, a one-time programmable memory, and a flash memory, for example.

The refresh counter 420 is configured to perform a counting operation in a normal refresh operation (CBR) to generate a CBR refresh row address CREF_ADDR. The refresh counter 420 may be initialized by a reset signal RESET, and may reset the refresh row address to 0, accordingly. The reset signal RESET may be generated after finishing a power-up sequence or finishing a power-down mode.

The refresh counter 420 incrementally increases the CBR refresh row address CREF_ADDR. The refresh counter 420 may initialize the CBR refresh row address CREF_ADDR as a minimum row address "0" when the CBR refresh row address CREF_ADDR becomes greater than a maximum row address.

The comparing unit 430 compares the CBR refresh row address CREF_ADDR transmitted from the refresh counter 420 with the address information ADDR_INFO read from the address storing unit 410. The comparing unit 430 generates a compare signal based on a comparison result. When the CBR refresh row address CREF_ADDR and the address information ADDR_INFO of the weak cell row coincide with each other, the compare signal generated by the comparing unit 430 is a signal MTCH, which is provided to the address changing unit 440.

The address changing unit 440 changes the weak cell row in the refresh leveraging operation in response to the match signal MTCH provided by the comparing unit 430. The match signal MTCH denotes that the CBR refresh row address CREF_ADDR (for example, WLa) in the normal refresh operation and the address information ADDR_INFO (for example, WLa) stored in the address storing unit 410 correspond to each other. Thus, the weak cell row WLa corresponding to the address information ADDR_INFO stored in the address storing unit 410 is refreshed during the CBR refresh operation.

Subsequently, when the refresh leveraging operation (LEV) is to be performed, the weak cell row WLa corresponding to the address information ADDR_INFO stored in the address storing unit 410 may be refreshed once more within the same leveraging cycle. That is, the weak cell row WLa may be repeatedly refreshed before the end of the refresh leveraging cycle of 16 ms, which may degrade repair efficiency of the refresh leverage resource.

To avoid repeatedly refreshing the same weak cell row during the same refresh leveraging cycle, the address changing unit 440 generates an address change signal INDX that changes the weak cell row for the next refresh leveraging operation (LEV), e.g., in response to the match signal MTCH. The address change signal INDX is provided to the address storing unit 410, which increases by one a pointer PTR of the address information ADDR_INFO stored in the address storing unit 410. Accordingly, when the time of the refresh leveraging operation (LEV) arrives, the weak cell row WLb, which has address information ADDR_INFO corresponding to the pointer PTR increased by one, is refreshed.

Figure 5:
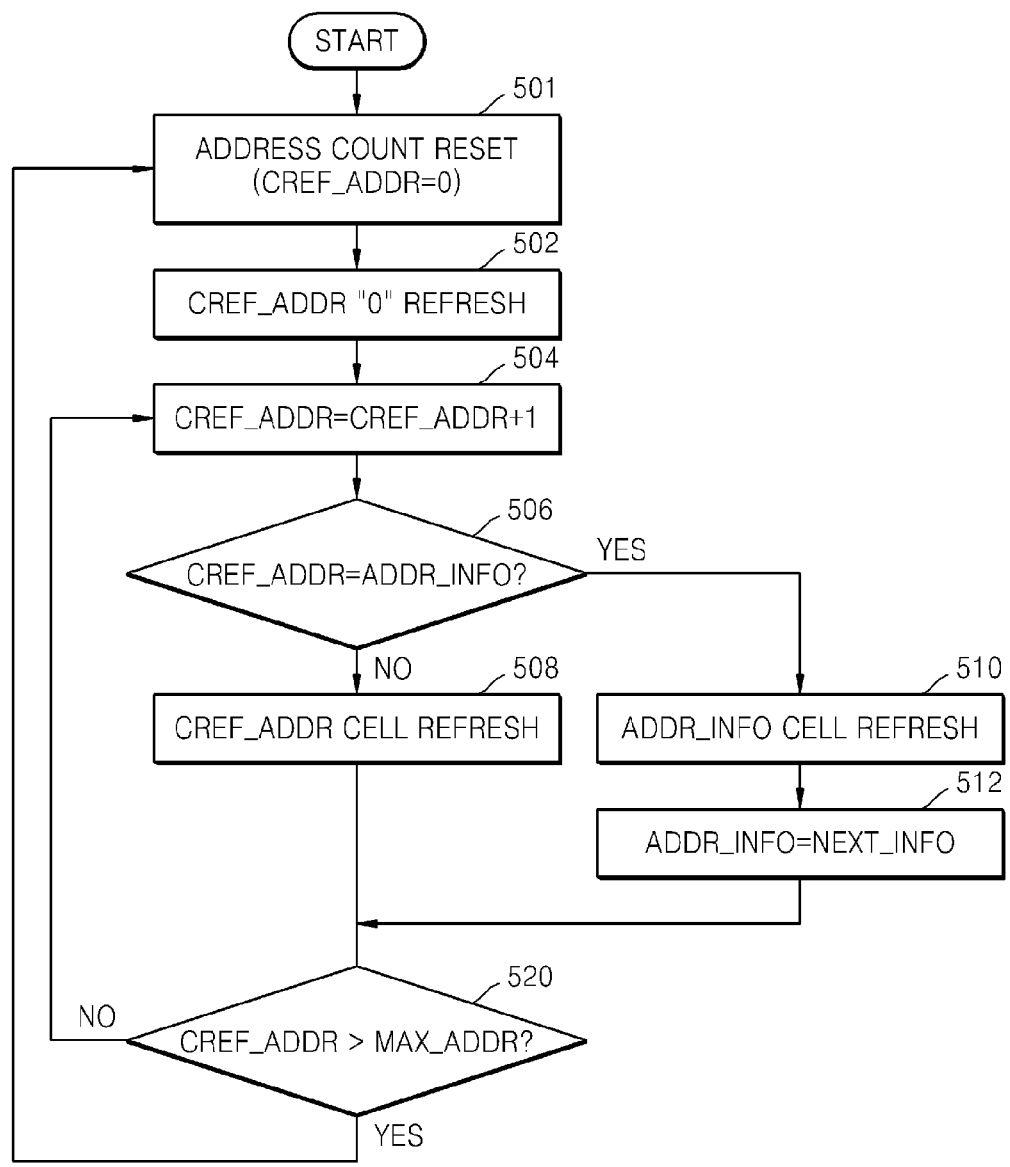
FIG. 5 is a flowchart illustrating a method of refreshing a volatile memory device, according to an embodiment of the inventive concept.

FIG. 5 is a flowchart illustrating a method of refreshing a volatile memory device according to an embodiment of the inventive concept. FIG. 5 is described with reference to the refresh address generator 400 shown in FIG. 4.

Referring to FIG. 5, when the refresh operation starts, the refresh counter 420 is initialized (S501), resetting the CBR refresh row address CREF_ADDR to as "0". A memory cell row corresponding to the CBR refresh row address "0" is refreshed (S502). The refresh counter 420 generates a CBR refresh row address CREF_ADDR that is increased by "1" (S504). The CBR refresh row address CREF_ADDR and the weak cell row of the address information ADDR_INFO stored in the address storing unit 410 are compared with each other (S506) to determine whether they match. When the CBR refresh row address CREF_ADDR does not coincide with the weak cell row of the address information ADDR_INFO stored in the address storing unit 410 (S506: No), the memory cell row corresponding to the CBR refresh row address CREF_ADDR is CBR refreshed (S508).

When the CBR refresh row address CREF_ADDR coincides with the weak cell row of the address information ADDR_INFO stored in the address storing unit 410 (S506: Yes), the corresponding weak cell row of the address information ADDR_INFO is CBR refreshed (S510). The weak cell row of the corresponding address information ADDR_INFO is refreshed once in the CBR refresh operation. This is because the pointer PTR of the address information ADDR_INFO stored in the address storing unit 410 is increased by one to change the address information ADDR_INFO, so that the next weak cell row (indicated by NEXT_INFO) becomes the address information ADDR_INFO and will be refreshed in the refresh leveraging operation (LEV) (S512). Since the original weak cell row of the address information ADDR_INFO stored in the address storing unit 410 is CBR refreshed (S510), the weak cell row of the address information ADDR_INFO corresponding to the increased pointer PTR is refreshed at the time of performing the refresh leveraging operation (LEV).

The CBR refresh row address CREF_ADDR is compared to a maximum row address MAX_ADDR of the memory cell rows included in the memory cell array (S520). When the CBR refresh row address CREF_ADDR is not greater than the maximum row address MAX_ADDR (S520: No), the refresh counter generates a CBR refresh row address CREF_ADDR increased by one (S504), and then the processes of S506, S508, S510, and/or S512 of the CBR refresh operation are repeated.

When the CBR refresh row address CREF_ADDR is greater than the maximum row address MAX_ADDR of the memory cell rows included in the memory cell array (S520: Yes), the CBR refresh row address CREF_ADDR is initialized again (S501), and the process is repeated. Since the CBR refresh row address CREF_ADDR is initialized, the memory cell rows included in the memory cell array may be sequentially refreshed again.

In addition, at the time of performing the refresh leveraging operation (LEV) during the refresh operation, the weak cell row of the address information ADDR_INFO designated by the pointer PRT of the address storing unit 410 may be refreshed. Here, when the weak cell row WLa is refreshed because the CBR refresh row address CREF_ADDR (for example, WLa) coincides with the weak cell row WLa of the address information ADDR_INFO stored in the address storing unit 410 in the previous CBR refresh operation, the weak cell row WLb of the address information ADD_INFO that is designated by the pointer PTR that has increased by one is refreshed in the refresh leveraging operation (LEV).

Figure 6:
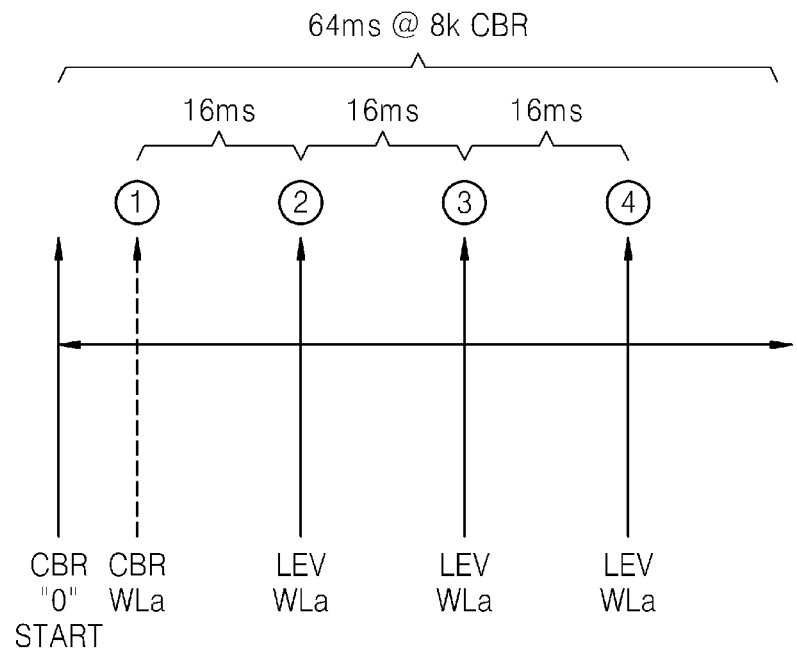
FIG. 6 is a diagram illustrating the refresh operation according to the refresh method of FIG. 5, according to an embodiment of the inventive concept.
Figure 7:
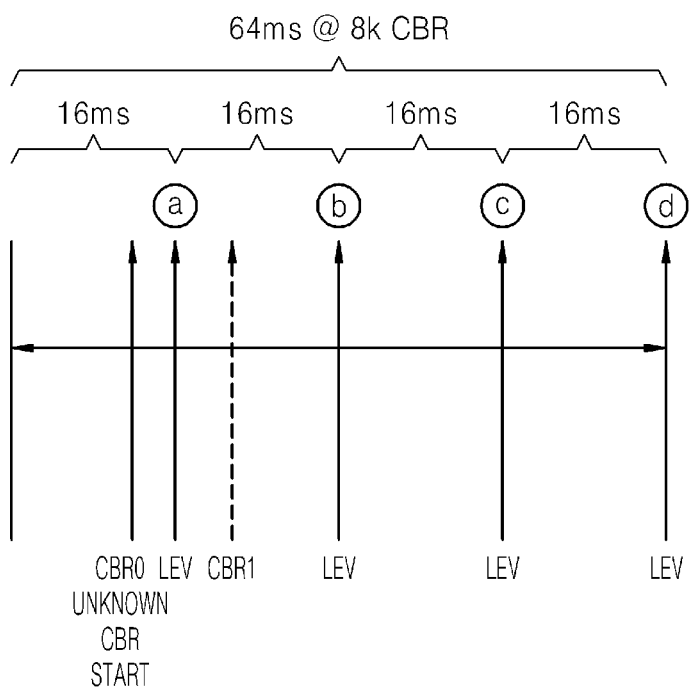
FIG. 7 is a diagram illustrating a refresh operation according to a comparative example.

The refresh operation shown in FIG. 5 will be described in more detail with reference to FIGS. 6 and 7. FIG. 6 is a diagram illustrating the refresh operation according to the refresh method according to the embodiment of the inventive concept, and FIG. 7 illustrates a comparative example.

Referring to FIG. 6, when the refresh operation starts, the refresh counter 420 is initialized so that the CBR refresh operation is performed with respect to the refresh row address "0", for example, the memory cell row WL0. The CBR refresh operations are performed with respect to the memory cell rows corresponding to the CBR refresh row address CREF_ADDR, which is incrementally increased by the refresh counter 420.

In a CBR refresh operation, when the CBR refresh row address CREF_ADDR coincides with the weak cell row WLa, which is the address information ADDR_INFO stored in the address storing unit 410, the corresponding weak cell row WLa is refreshed once in the normal CBR refresh operation (①).

Once the weak cell row WLa is refreshed by the CBR refresh operation (①), the refresh leveraging operation (LEV) with respect to the weak cell row WLa may be performed. For example, after the CBR refresh operation, the refresh leveraging operation (LEV) with respect to the weak cell row WLa may be set as three times (②③④). Accordingly, the refresh leveraging operation (LEV) with respect to the weak cell row WLa may be performed three times within the refresh period of 64 ms (②③④).

Referring to FIG. 7, the refresh leverage cycle of 16 ms is set four times (ⓐⓑⓒⓓ) uniformly during the refresh period of 64 ms. When starting the refresh operation, at a point when the CBR refresh row address is unknown, a memory cell row of unknown CBR refresh row address may be refreshed by the CBR refresh operation (CBR0).

In the CBR refresh operation, the refresh row address may coincide with the address information ADDR_INFO stored in the address storing unit 410, and the weak cell row of the address information ADDR_INFO may be refreshed (CBR1). After that, at the time of performing the refresh leveraging operation (LEV) (ⓑ), the weak cell row of the address information ADDR_INFO stored in the address storing unit 410, which is already refreshed by the CBR refresh operation (CBR1), may be refreshed once more. The weak cell row of the address information ADDR_INFO stored in the address storing unit 410 may be double refreshed within a period that is shorter than the refresh leverage cycle of 16 ms.

Efficiencies of the refresh leverage resources according to the refresh methods shown in FIGS. 6 and 7 are compared, as shown in Table 1.

TABLE 1

| | Number of times refresh leveraging operations need to be performed for repairing weak cell row | | Number of weak cell rows that may be relieved by 512 refresh leverage resources | | Repair ratio of FIG. 6 with respect to FIG. 7 |
|---|---|---|---|---|---|
| | FIG. 7 | FIG. 6 | FIG. 7 | FIG. 6 | |
| 64 ms | 4 times | 3 times | 128 | 170 | 33% |
| 32 ms | 2 times | 1 time | 256 | 512 | 100% |

Referring to Table 1, four refresh leveraging operations are necessary for relieving the weak cell row WLa with a cycle of 16 ms in the refresh period of 64 ms in FIG. 7, and three refresh leveraging operations are necessary in FIG. 6. In this case, the number of weak cell rows that may be repaired by 512 refresh leverage resources is 128 (512/4) in FIG. 7 and 170 (512/3) in FIG. 6. Accordingly, the weak cell row repair rate of FIG. 6 is 33 percent greater than that of FIG. 7.

Two refresh leveraging operations are necessary for relieving the weak cell row with a cycle of 16 ms in the refresh period of 32 ms in FIG. 7, and one refresh leveraging operation is necessary in FIG. 6. In this case, the number of weak cell rows that may be repaired by 512 refresh leverage resources is 256 (512/2) in FIG. 7, and 512 (512/1) in FIG. 6. Accordingly, the weak cell row repair rate of FIG. 6 is 100 percent greater than that of FIG. 7.

Figure 8:
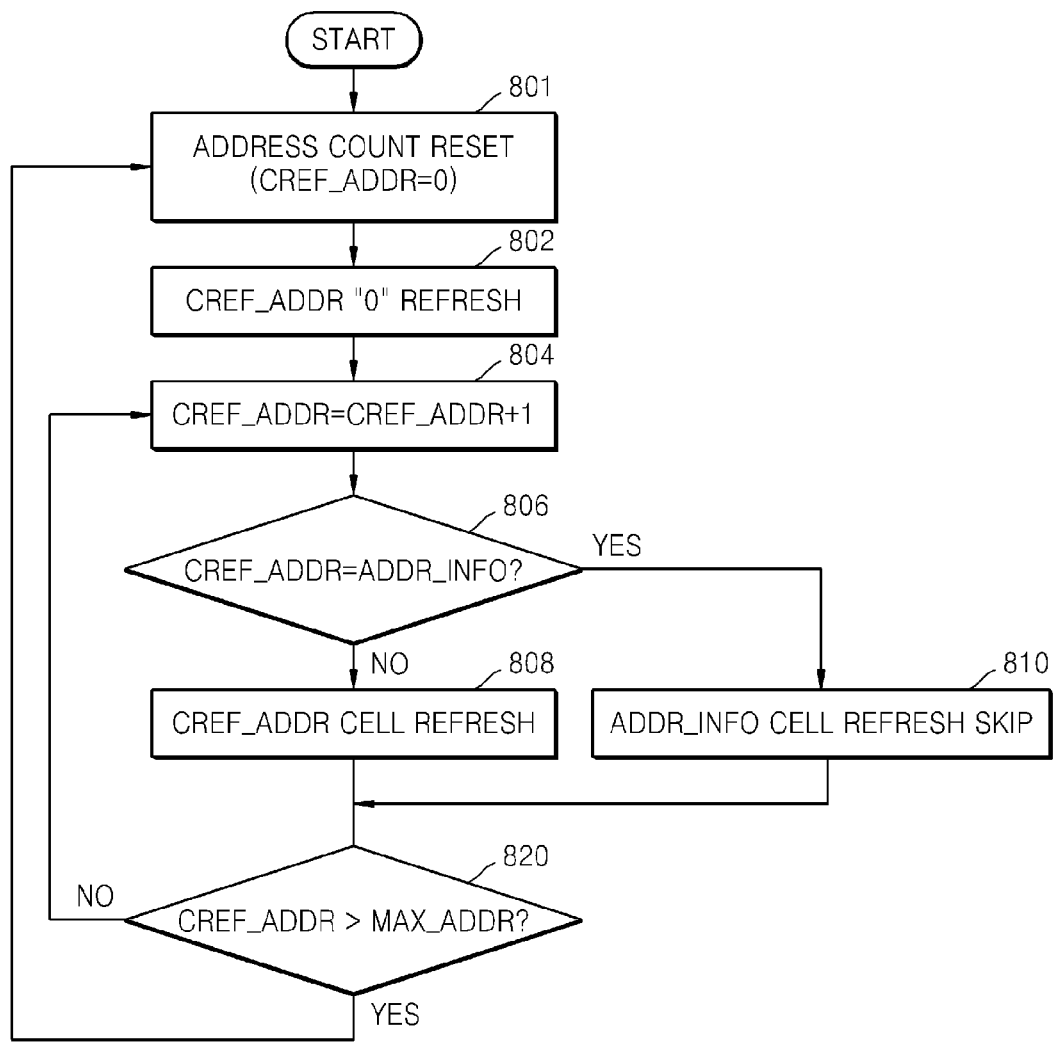
FIG. 8 is a flowchart illustrating a method of refreshing a volatile memory device, according to another embodiment of the inventive concept.

FIG. 8 is a flowchart illustrating a method of refreshing a volatile memory device according to another embodiment of the inventive concept. The flowchart of FIG. 8 will be described with reference to the refresh address generator 400 shown in FIG. 4.

The flowchart shown in FIG. 8 is different from that of FIG. 5 in that when a CBR refresh row address CREF_ADDR coincides with the weak cell row of the address information ADDR_INFO stored in the address storing unit 410 (S806: Yes), the corresponding weak cell row is skipped rather than refreshed (S810). Thus, the CBR refresh operation is not performed with respect to the weak cell row of the address information ADDR_INFO stored in the address storing unit 410. In this case, the weak cell row of the address information ADDR_INFO is only refreshed according to the refresh leveraging operations (LEV).

In particular, when the refresh operation starts, the refresh counter 420 is initialized (S801), and the CBR refresh row address CREF_ADDR is reset to "0." The memory cell row corresponding to the CBR refresh row address is refreshed (S802). The refresh counter 420 generates a CBR refresh row address CREF_ADDR that is increased by 1 (S804), and the increased CBR refresh row address CREF_ADDR and the address information ADDR_INFO stored in the address storing unit 410 are compared with each other (S806). When the CBR refresh row address CREF_ADDR does not coincide with the address information ADDR_INFO stored in the address storing unit 410 (S806: No), the memory cell row corresponding to the CBR refresh row address CREF_ADDR is refreshed (S808).

When the CBR refresh row address CREF_ADDR coincides with the weak cell row of the address information ADDR_INFO stored in the address storing unit 410 (S806: Yes), the refresh operation with respect to the corresponding weak cell row is not performed (S810), because the weak cell row of the address information ADDR_INFO stored in the address storing unit 410 will be refreshed in the refresh leveraging operations (LEV).

The CBR refresh row address CREF_ADDR is compared to a maximum row address MAX_ADDR of the memory cell rows included in the memory cell array (S820). When the CBR refresh row address CREF_ADDR is not greater than the maximum row address MAX_ADDR (S820: No), the refresh counter generates a CBR refresh row address CREF_ADDR that is increased by 1 (S804), and then the processes of S806, S808, and/or S810 of the CBR refresh operation including are repeated.

When the CBR refresh row address CREF_ADDR is greater than the maximum row address MAX_ADDR of the memory cell rows included in the memory cell array (S820: Yes), the CBR refresh row address CREF_ADDR is initialized again (S801), and the process is repeated. That is, since the CBR refresh row address CREF_ADDR is initialized, the memory cell rows included in the memory cell array may be sequentially refreshed again.

In addition, during the refresh operation, at the time of performing the refresh leveraging operation (LEV), weak cell rows of the address information ADDR_INFO designated by the pointer PTR of the address storing unit 410 may be sequentially refreshed.

Figure 9:
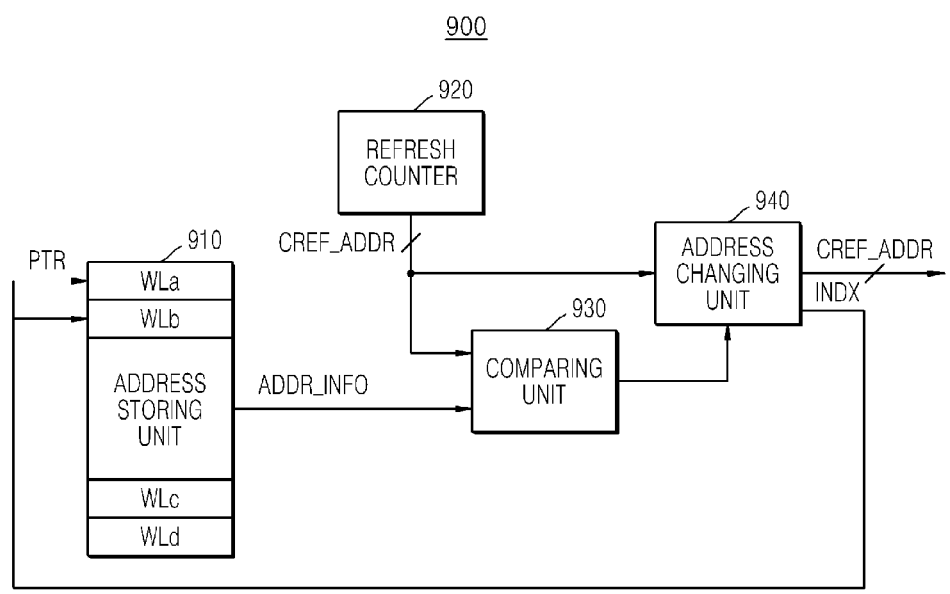
FIG. 9 is a diagram showing another example of the refresh address generator shown in FIG. 3, according to an embodiment of the inventive concept.

FIG. 9 is a diagram showing another example of the refresh address generator 900 shown in FIG. 3, according to the embodiment of the inventive concept.

Referring to FIG. 9, the refresh address generator 900 includes an address storing unit 910, a refresh counter 920, a comparing unit 930, and an address changing unit 940. The refresh address generator 900 is different from the refresh address generator 400 shown in FIG. 4 in that the refresh counter 920 is not initialized by the reset signal RESET. Thus, the refresh counter 420 of FIG. 4 is initialized by the reset signal RESET to output the CBR refresh row address CREF_ADDR of "0," while the refresh counter 920 outputs an arbitrary CBR refresh row address CREF_ADDR according to the counting operation.

The address storing unit 910 includes address information ADDR_INFO about at least one weak cell row WLa, WLb, WLc, or WLd. The address information ADDR_INFO stored in the address storing unit 910 is sequentially refreshed at timings of performing refresh leveraging operations (LEV) (e.g., a weak cell refresh period) during the refresh operation, according to an order designated by a pointer PTR.

The refresh counter 920 performs a counting operation in the normal CBR refresh operation during the refresh operation to generate the CBR refresh row address CREF_ADDR. The refresh counter 920 may output an arbitrary CBR refresh row address CREF_ADDR according to the counting operation.

The refresh counter 920 incrementally increases the CBR refresh row address CREF_ADDR, and when the CBR refresh row address CREF_ADDR becomes greater than the maximum row address, the refresh counter 920 initializes the CBR refresh row address CREF_ADDR as the minimum row address "0." After that, the refresh counter 920 generates CBR refresh row address CREF_ADDR that incrementally increases from the minimum row address "0."

The comparing unit 930 compares the CBR refresh row address CREF_ADDR transmitted from the refresh counter 920 with the address information ADDR_INFO read from the address storing unit 910. The comparing unit 930 may generate a match signal MTCH based on a comparison result. That is, when the CBR refresh row address CREF_ADDR coincides with the address information ADDR_INFO of the weak cell row, the comparing unit 930 provides the match signal MTCH to the address changing unit 940.

The address changing unit 940 changes the weak cell row of the refresh leveraging operation in response to the match signal MTCH provided by the comparing unit 930. The address changing unit 940 generates an address change signal INDX for changing the weak cell row of the refresh leveraging operation in response to the match signal MTCH. The address change signal INDX is provided to the address storing unit 910 so as to increase the pointer PTR of the address information ADDR_INFO stored in the address storing unit 910 for performing the refresh leveraging operation (LEV). When the refresh leveraging operation (LEV) has to be performed, the weak cell row WLb of the address information ADD_INFO corresponding to the pointer PTR that has increased by 1 is refreshed.

Figure 10:
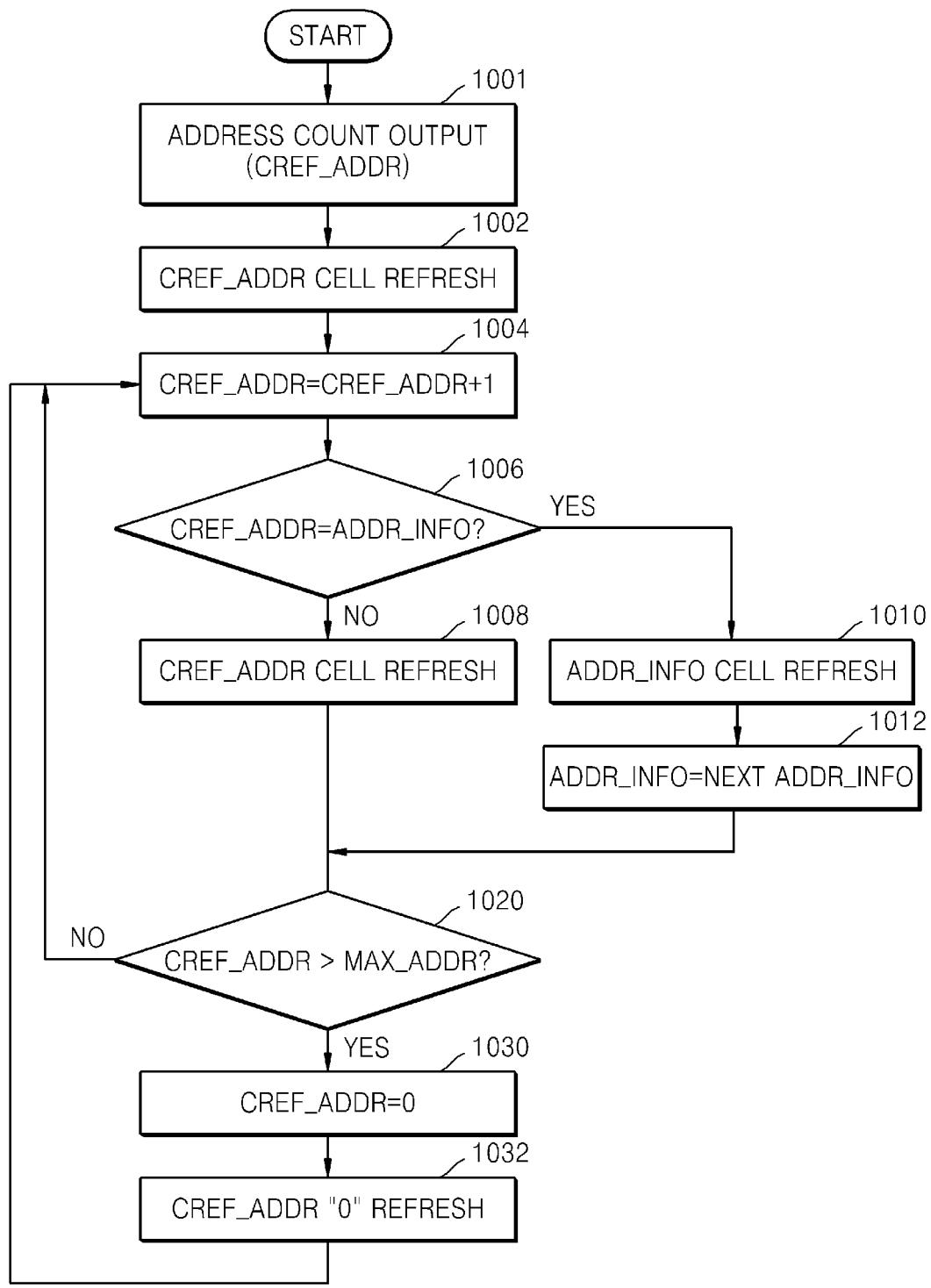
FIG. 10 is a flowchart illustrating a method of refreshing a volatile memory device, according to another embodiment of the inventive concept.

FIG. 10 is a flowchart illustrating a refresh method of a volatile memory device according to another embodiment of the inventive concept. The flowchart of FIG. 10 is described with reference to the refresh address generator 900 shown in FIG. 9.

Referring to FIG. 10, when a refresh operation starts, the refresh counter 920 may output an arbitrary CBR refresh row address CREF_ADDR according to the counting operation (S1001). A memory cell row corresponding to the CBR refresh row address CREF_ADDR output from the refresh counter 920 is refreshed (S1002). The refresh counter 920 generates a CBR refresh row address CREF_ADDR that is increased by 1 (S1004). The increased CBR refresh row address CREF_ADDR is compared to the address information ADDR_INFO stored in the address storing unit 910 (S1006). When the CBR refresh row address CREF_ADDR does not coincide with the weak cell row of the address information ADDR_INFO stored in the address storing unit 910 (S1006: No), the memory cell row corresponding to the CBR refresh row address CREF_ADDR is refreshed (S1008).

When the CBR refresh row address CREF_ADDR coincides with the weak cell row of the address information ADDR_INFO stored in the address storing unit 910 (S1006: Yes), the corresponding weak cell row is CBR refreshed (S1010). In addition, the pointer PTR of the address information ADDR_INFO stored in the address storing unit 910, which will undergo the refresh leveraging operation (LEV), is increased by 1, so that next address information ADD_INFO is refreshed in the refresh leveraging operation (LEV) (S1012).

The CBR refresh row address CREF_ADDR is compared to a maximum row address MAX_ADDR of the memory cell rows included in the memory cell array (S1020). When the CBR refresh row address CREF_ADDR is not greater than the maximum row address MAX_ADDR (S1020: No), the refresh counter generates a CBR refresh row address CREF_ADDR that is increased by 1 (S1004), and processes S1006, S1008, S1010, and/or S1012 of the CBR refresh operation including are repeated.

When the CBR refresh row address CREF_ADDR is greater than the maximum row address MAX_ADDR of the memory cell rows included in the memory cell array (S1020: Yes), the CBR refresh row address CREF_ADDR of the refresh counter 920 is initialized to 0 (S1030). The memory cell row corresponding to the CBR refresh row address "0" is refreshed (S1032). The refresh counter 920 generates a CBR refresh row address CREF_ADDR that is increased by 1 (S1004), and processes of S1006, S1008, S1010, and/or S1012 of the CBR refresh operation are repeated.

In addition, at a timing of performing the refresh leveraging operation (LEV) during the refresh operation, the weak cell row of the address information ADDR_INFO that is designated by the pointer PTR of the address storing unit 910 or the pointer PTR changed by the address change signal INDX may be refreshed.

Figure 11:
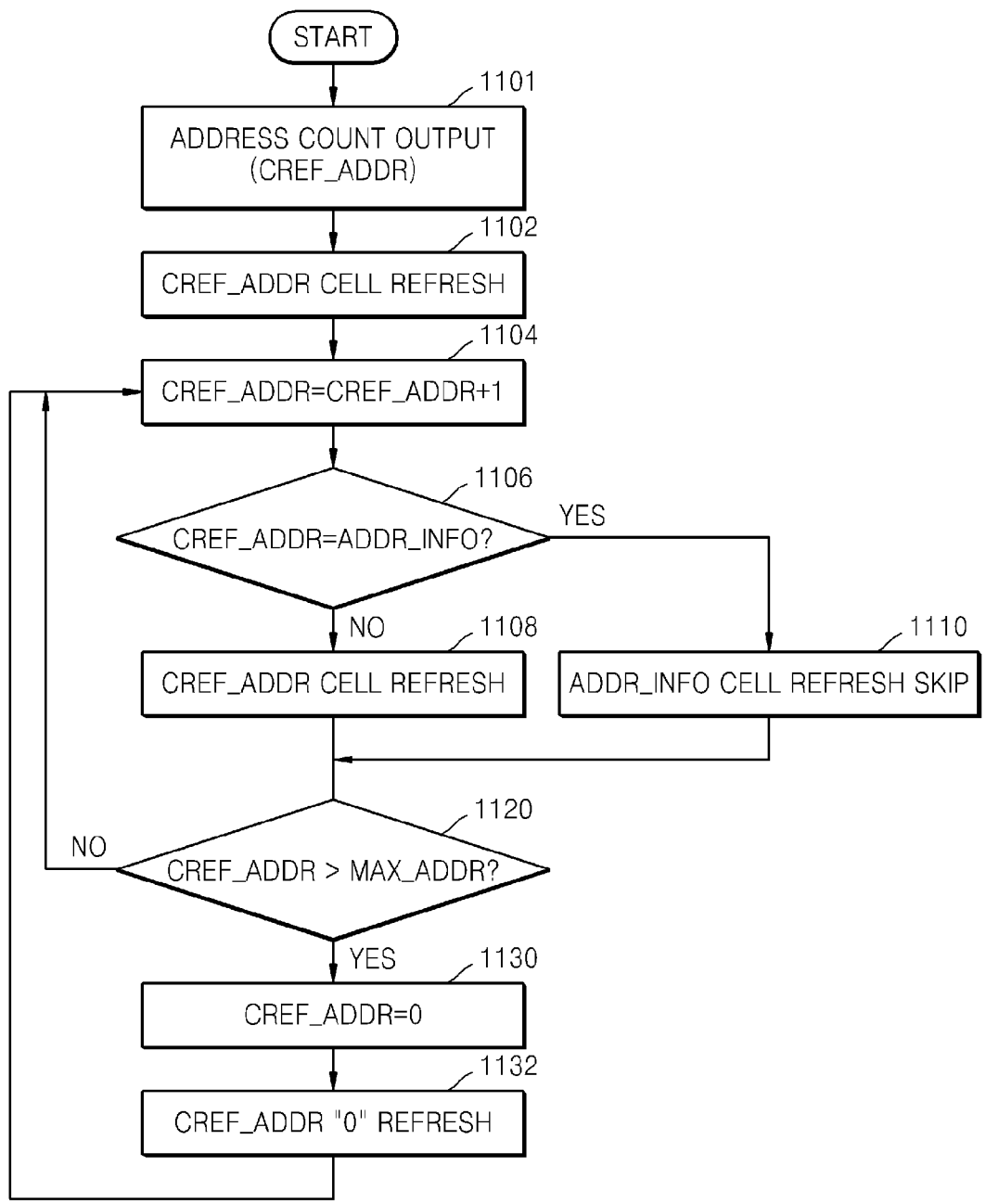
FIG. 11 is a flowchart illustrating a method of refreshing a volatile memory device, according to another embodiment of the inventive concept.

FIG. 11 is a flowchart illustrating a method of refreshing a volatile memory device according to another embodiment of the inventive concept. The flowchart of FIG. 11 will be described with reference to the refresh address generator 900 shown in FIG. 9.

Referring to FIG. 11, the refresh method of the present embodiment is different from the embodiment shown in FIG. 10 in that, when the CBR refresh row address CREF_ADDR coincides with the weak cell row of the address information ADDR_INFO stored in the address storing unit 910 (S1106: Yes), the CBR refresh with respect to the corresponding weak cell row is skipped rather than refreshed (S1110), in order not to perform the CBR refresh operation with respect to the weak cell row of the address information ADDR_INFO stored in the address storing unit 910. In this case, the weak cell row of the address information ADDR_INFO is only refreshed according to the refresh leveraging operations (LEV).

When a refresh operation starts, the refresh counter 920 outputs an arbitrary CBR refresh row address CREF_ADDR according to the counting operation (S1101), and the memory cell row corresponding to the CBR refresh row address output from the refresh counter 920 is refreshed (S1102). The refresh counter 920 generates a CBR refresh row address CREF_ADDR that is increased by 1 (S1104). The CBR refresh row address CREF_ADDR is compared with the address information ADDR_INFO stored in the address storing unit 910 (S1106).

When the CBR refresh row address CREF_ADDR does not coincide with the weak cell row of the address information ADDR_INFO stored in the address storing unit 910 (S1106: No), the memory cell row corresponding to the CBR refresh row address CREF_ADDR is refreshed (S1108). When the CBR refresh row address CREF_ADDR coincides with the weak cell row of the address information ADDR_INFO stored in the address storing unit 910 (S1106: Yes), the corresponding weak cell row is not refreshed (S1110), because the weak cell row of the address information ADDR_INFO stored in the address storing unit 910 will be refreshed in the refresh leveraging operation (LEV).

The CBR refresh row address CREF_ADDR is compared to a maximum row address MAX_ADDR of the memory cell rows included in the memory cell array (S1120). When the CBR refresh row address CREF_ADDR is not greater than the maximum row address MAX_ADDR (S1120: No), the refresh counter generates a CBR refresh row address CREF_ADDR that is increased by 1 (S1104), and the processes of S1106, S1108, and/or S1110 of the CBR refresh operation are repeated.

When the CBR refresh row address CREF_ADDR is greater than the maximum row address MAX_ADDR of the memory cell rows included in the memory cell array (S1120: Yes), the CBR refresh row address CREF_ADDR of the refresh counter 920 is initialized to 0 (S1130). The memory cell row corresponding to the CBR refresh row address "0" is refreshed (S1132). The refresh counter 920 generates a CBR refresh row address CREF_ADDR that is increased by 1 (S1104), and the processes of S1106, S1108, and/or S1110 of the CBR refresh operation are repeated.

In addition, at timings of performing the refresh leveraging operation (LEV) during the refresh operation, the weak cell row of the address information ADDR_INFO designated by the pointer PTR of the address storing unit 910 may be sequentially refreshed.

Figure 12:
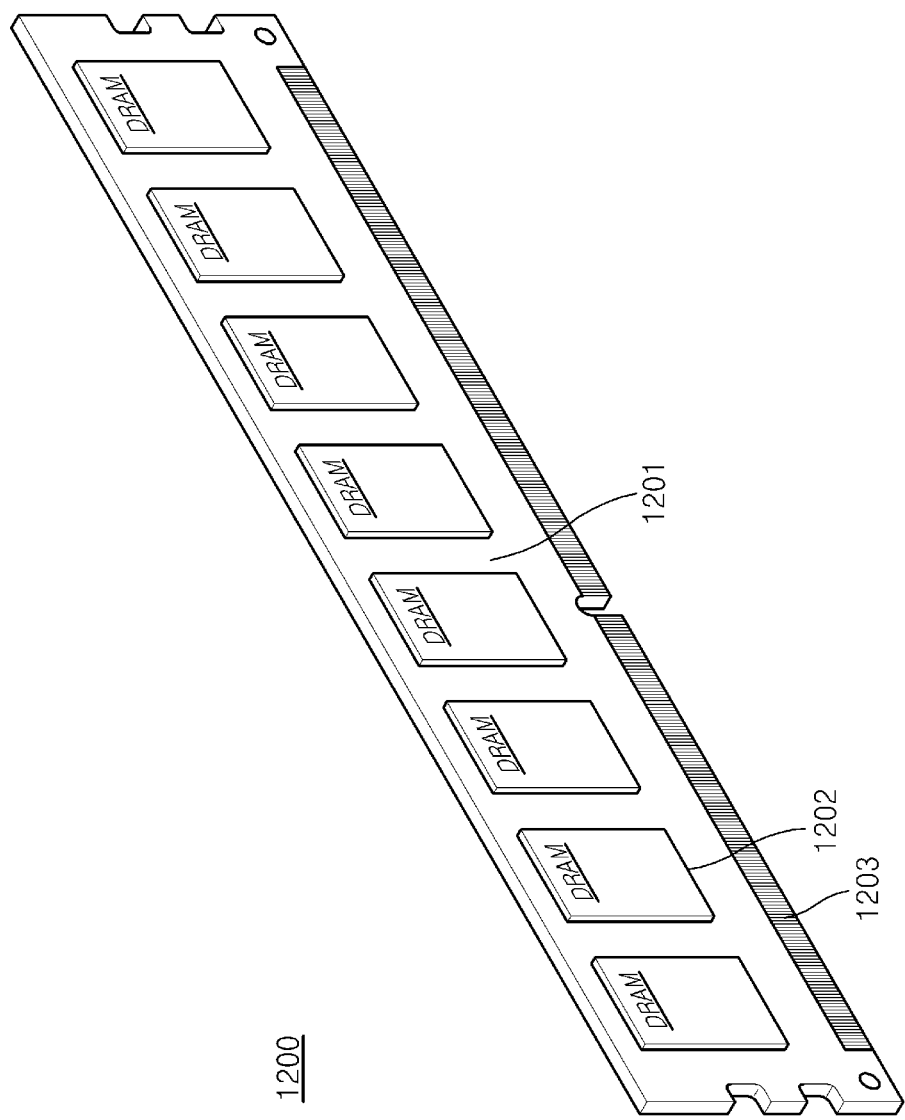
FIGS. 12 through 14 are perspective views of memory modules including dynamic random access memory (DRAM) configured to perform a refresh method, according to embodiments of the inventive concept.
Figure 13:
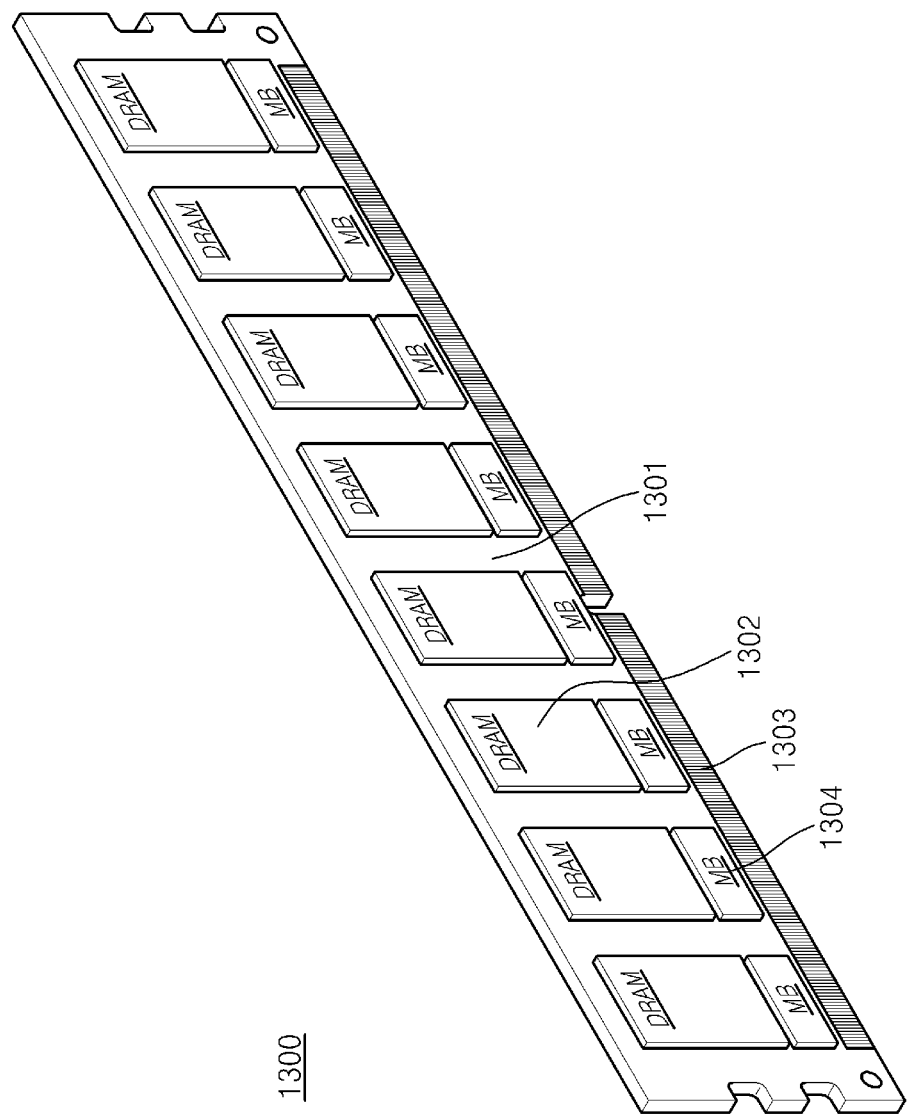
Figure 14:
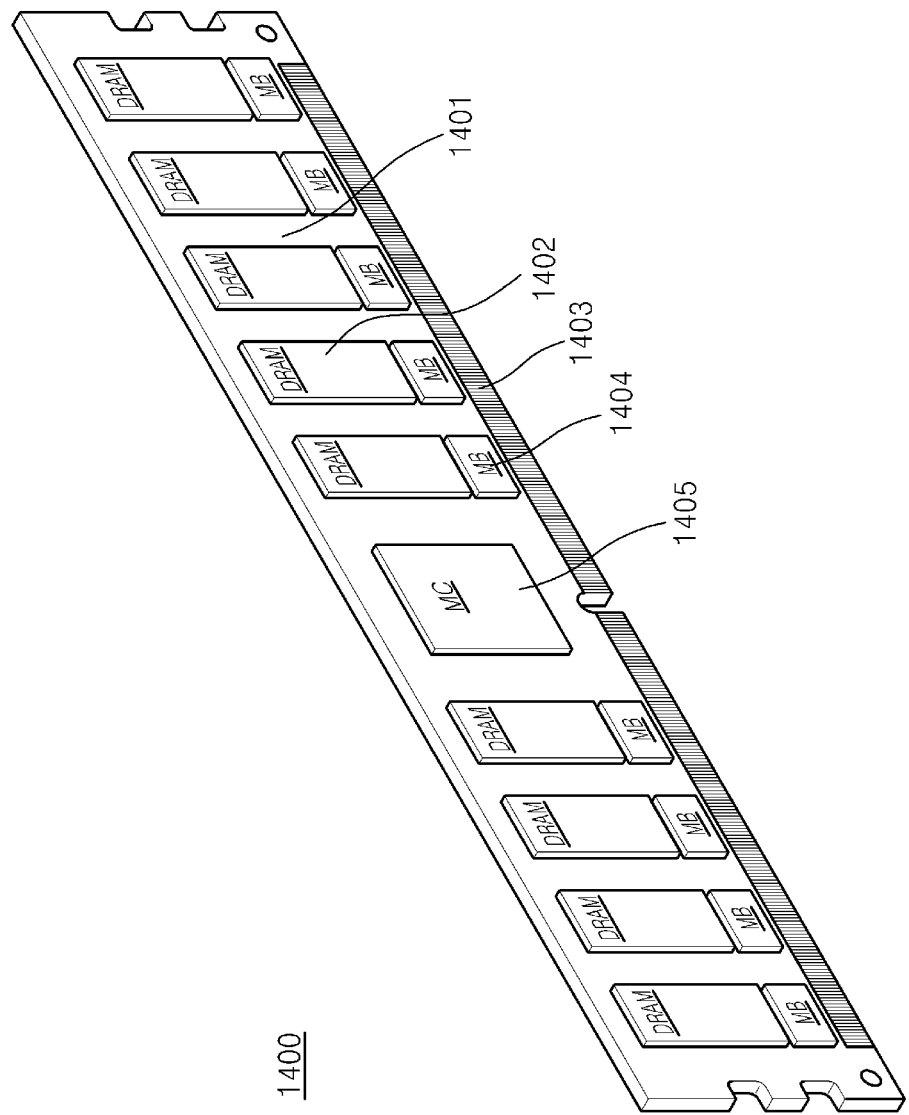

FIGS. 12 through 14 are perspective views of memory modules including dynamic random access memory (DRAM) configured to perform a refresh method, according to embodiments of the inventive concept.

Referring to FIG. 12, a memory module 1200 includes a printed circuit board 1201, a plurality of DRAM chips 1202, and a connector 1203. The DRAM chips 1202 may be coupled to upper and lower surfaces of the printed circuit board 1201. The connector 1203 is electrically connected to the DRAM chips 1202 via conductive lines (not shown). Also, the connector 1203 may be connected to a slot of an external host.

The refresh method of each of the DRAM chips 1202 may include storing address information about at least one weak cell row address that has to be refreshed according to a period that is shorter than a refresh period, performing a counting operation so as to generate a refresh row address, comparing the refresh row address with the address information, when the refresh row address and the weak cell row address coincide with each other as a result of comparison, refreshing the weak cell row address, changing the weak cell row address by changing a pointer of the address information, and refreshing the changed weak cell row address with the period that is shorter than the refresh period.

The refresh method of each of the DRAM chips 1202 may include storing address information about at least one weak cell row address that has to be refreshed according to a period that is shorter than a refresh period, performing a counting operation to generate refresh row addresses, and comparing the refresh row address with the address information, skipping refresh of the weak cell row address when the refresh row address and the weak cell row address coincide with each other as a result of comparison, and refreshing the changed weak cell row address with the period that is shorter than the refresh period, where the weak cell row address of the address information may not be refreshed at the refresh period.

Referring to FIG. 13, a memory module 1300 includes a printed circuit board 1301, a plurality of DRAM chips 1302, a connector 1303, and a plurality of buffer chips 1304. The buffer chips 1304 may be disposed between respective DRAM chips 1302 and the connector 1303. The DRAM chips 1302 and the buffer chips 1304 may be provided on upper and lower surfaces of the printed circuit board 1301. The DRAM chips 1302 and the buffer chips 1304 provided on the upper and lower surfaces of the printed circuit board 1301 may be connected to each other via a plurality of via holes.

The refresh method of each of the DRAM chips 1302 may include storing address information about at least one weak cell row address that has to be refreshed according to a period that is shorter than a refresh period, performing a counting operation to generate a refresh row address, and comparing the refresh row address with the address information, refreshing the weak cell row address when the refresh row address and the weak cell row address coincide with each other as a result of comparison, changing the weak cell row address by changing the pointer PR of the address information, and refreshing the changed weak cell row address with the period that is shorter than the refresh period.

The refresh method of each of the DRAM chips 1302 may include storing address information about at least one weak cell row address that has to be refreshed according to a period that is shorter than a refresh period, performing a counting operation to generate a refresh row address, comparing the refresh row address with the address information, skipping the refresh of the weak cell row when the refresh row address and the weak cell row address coincide with each other as a result of comparison, and refreshing the weak cell row of the address information with a period that is shorter than the refresh period, wherein the weak cell row address of the address information may be set so as not to be refreshed with the refresh period.

The buffer chip 1304 may store results of testing characteristics of the DRAM chip 1302 connected to the buffer chip 1304. The buffer chip 1304 manages operations of the corresponding DRAM chip 1302 by using characteristic information stored therein in order to reduce affects of the weak cell or a weak page to operations of the DRAM chip 1302. For example, the buffer chip 1304 includes storage to repair the weak cell or the weak page of the DRAM chip 1302.

Referring to FIG. 14, the memory module 1400 includes a printed circuit module 1401, a plurality of DRAM chips 1402, a connector 1403, a plurality of buffer chips 1404, and a controller 1405. The controller 1405 communicates with the DRAM chips 1402 and the buffer chips 1404, and controls operation modes of the DRAM chips 1402. The controller 1405 may control various functions, characteristics, and modes using a mode register in each of the DRAM chips 1402, for example.

The refresh method of each of the DRAM chips 1402 may include storing address information about at least one weak cell row address that has to be refreshed according to a period that is shorter than a refresh period, performing a counting operation to generate a refresh row address, comparing the refresh row address with the address information, refreshing the weak cell row address when the refresh row address and the weak cell row address coincide with each other as a result of comparison, changing the weak cell row address by changing the pointer PR of the address information, and refreshing the changed weak cell row address with the period that is shorter than the refresh period.

The refresh method of each of the DRAM chips 1402 may include storing address information about at least one weak cell row address that has to be refreshed according to a period that is shorter than a refresh period, performing a counting operation so as to generate a refresh row address, comparing the refresh row address with the address information, skipping the refresh of the weak cell row when the refresh row address and the weak cell row address coincide with each other as a result of comparison, and refreshing the weak cell row of the address information with the period that is shorter than the refresh period, where the weak cell row address of the address information may be set so as not to be refreshed with the refresh period.

The DRAM modules 1200, 1300, and 1400 may be applied in various memory modules, such as a single in-line memory module (SIMM), a dual in-line memory module (DIMM), a small-outline DIMM (SO-DIMM), an unbuffered DIMM (UDIMM), a fully-buffered DIMM (FBDIMM), a rank-buffered DIMM (RBDIMM), a load-reduced DIMM (LRDIMM), mini-DIMM, and a micro-DIMM.

Figure 15:
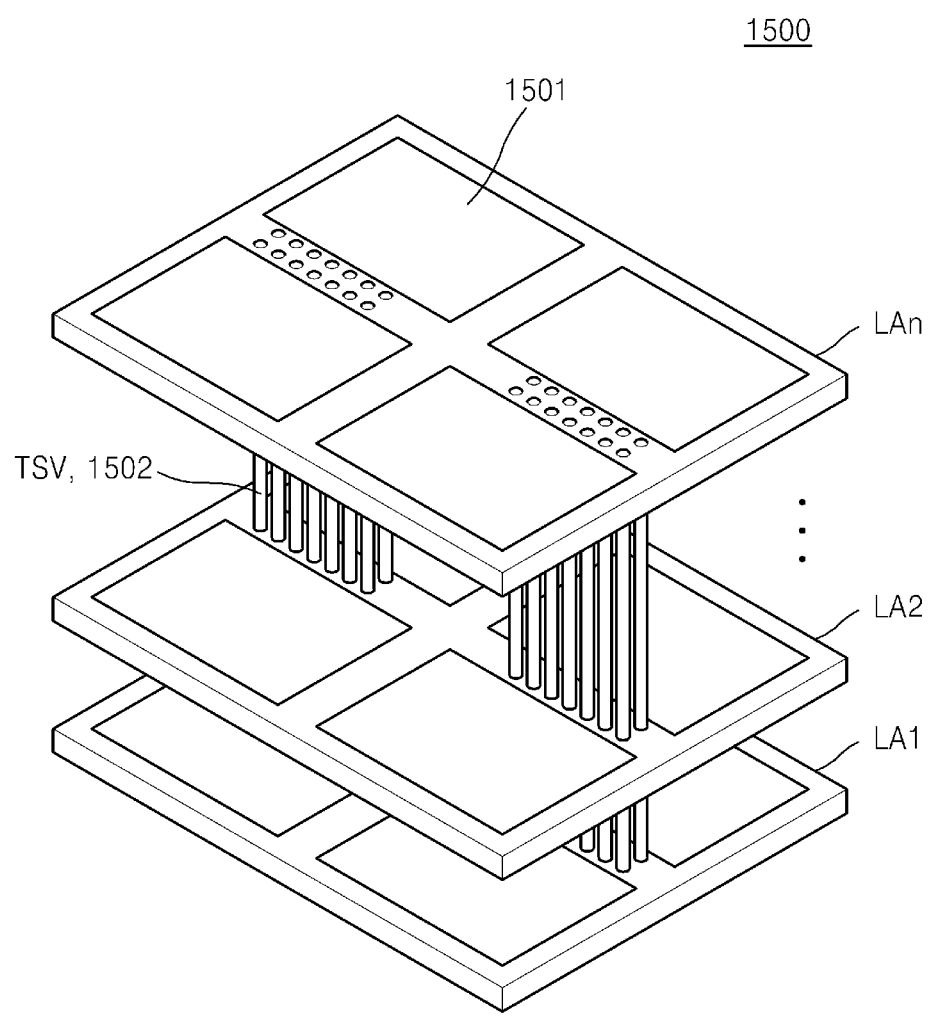
FIG. 15 is a perspective view of a stacked type, semiconductor apparatus, which includes layers of DRAM semiconductors performing refresh methods according to embodiments of the inventive concept.

FIG. 15 is a perspective view of a stacked type, semiconductor apparatus, which includes layers of DRAM semiconductors performing refresh methods according to embodiments of the inventive concept.

Referring to FIG. 15, a semiconductor apparatus 1500 includes a plurality of DRAM semiconductor layers LA1 through LAn. Each of the semiconductor layers LA1 through LAn may be a memory chip including memory cell arrays 1501 consisting of DRAM cells, where some of the semiconductor layers LA1 through LAn are master chips interfacing with an external controller and others of the semiconductor layers LA1 through LAn may be slave chips storing data. For example, in FIG. 15, the semiconductor layer LA1 located at the lowermost position may be a master chip, and the other semiconductor layers LA2 through LAn may be slave chips.

The semiconductor layers LA1 through LAn transmit/receive signals via a through silicon via (TSV) 1502. The master chip LA1 may communicate with an external memory controller (not shown) via a conductive unit (not shown) formed on an outer surface thereof.

Also, signal transfers between the semiconductor layers LA1 through LAn may be performed by optical input/output (IO) connections, for example, a radiative type using a radio frequency (RF) wave or an ultrasound wave, an inductive coupling type using a magnetic induction, or a non-radiative type using a magnetic field resonance.

The radiative type input/output (IO) connection wirelessly transfers signals using an antenna such as a monopole or a planar inverted-F antenna (PIFA). Radiation occurs while electric fields and/or magnetic fields varying according to time affect each other. If there is an antenna of the same frequency, a signal may be received according to polarization properties of an incident wave. The inductive coupling type input/output (IO) connection generates a strong magnetic field in a particular direction by winding a coil multiple times, and provides a coupling by approaching coils resonating at similar frequencies. The non-radiative type input/output (IO) connection uses evanescent wave coupling that moves electromagnetic waves between two media that resonate at the same frequency via a near-distance electronic field.

The refresh method of each of the semiconductor layers LA1 through LAn may include storing address information about at least one weak cell row address that has to be refreshed according to a period that is shorter than a refresh period, performing a counting operation to generate a refresh row address, comparing the refresh row address with the address information, refreshing the weak cell row address when the refresh row address and the weak cell row address coincide with each other as a result of comparison, changing the weak cell row address by changing the pointer PR of the address information, and refreshing the changed weak cell row address with the period that is shorter than the refresh period.

The refresh method of each of the semiconductor layers LA1 through LAn may include storing address information about at least one weak cell row address that has to be refreshed according to a period that is shorter than a refresh period, performing a counting operation so as to generate a refresh row address, comparing the refresh row address with the address information, skipping the refresh of the weak cell row when the refresh row address and the weak cell row address coincide with each other as a result of comparison, and refreshing the weak cell row of the address information with the period that is shorter than the refresh period, where the weak cell row address of the address information may be set so as not to be refreshed with the refresh period.

In the module structures shown in FIGS. 12 through 14, each of the DRAM chips may include a plurality of DRAM semiconductor layers LA1 through LAn.

Figure 16:
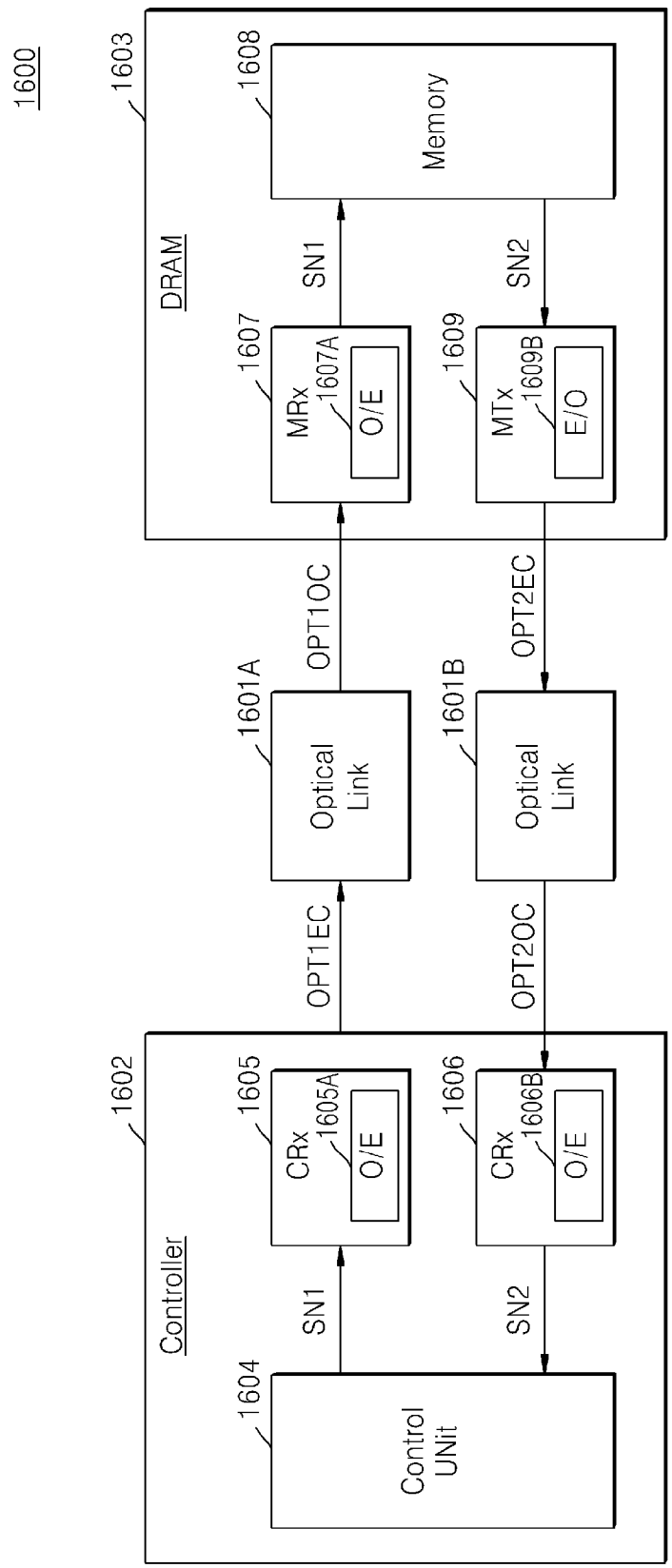
FIG. 16 is a block diagram of a memory system including DRAM configured to perform a refresh method according to embodiments of the inventive concept.

FIG. 16 is a bock diagram of a memory system 1600 including DRAM configured to perform a refresh method according to embodiments of the inventive concept.

Referring to FIG. 16, the memory system 1600 includes optical connection apparatuses or optical links 1601A and 1601B, a controller 1602, and DRAM 1603. The optical links 1601A and 1601B interconnect the controller 1602 and the DRAM 1603. The controller 1602 includes a control unit 1604, a first transmission unit 1605, and a first receipt unit 1606. The control unit 1604 transmits a first electric signal SN1 to the first transmission unit 1605. The first electric signal SN1 may include command signals transmitted to the DRAM 1603, clocking signals, address signals, and/or write data.

The first transmission unit 1605 includes a first optical modulator 1605A. The first optical modulator 1605A converts the first electric signal SN1 to a first optical transmission signal OTP1EC, and transmits the signal to the optical link 1601A. The first optical transmission signal OTP1EC is transmitted by serial communication via the optical link 1601A. The first receipt unit 1606 includes a first optical demodulator 1606B. The first demodulator 1606B converts a second optical receipt signal OPT2OC transmitted from the optical link 1601B into a second electric signal SN2, and transmits the signal to the control unit 1604.

The DRAM 1603 includes a second receipt unit 1607, a memory area 1608 including a memory cell array, and a second transmission unit 1609. The refresh method of the memory area 1608 may include storing address information about at least one weak cell row address that has to be refreshed according to a period that is shorter than a refresh period, performing a counting operation to generate a refresh row address, comparing the refresh row address with the address information, refreshing the weak cell row address when the refresh row address and the weak cell row address coincide with each other as a result of comparison, changing the weak cell row address by changing the pointer PR of the address information, and refreshing the changed weak cell row address with the period that is shorter than the refresh period.

The refresh method of the memory area 1608 may include storing address information about at least one weak cell row address that has to be refreshed according to a period that is shorter than a refresh period, performing a counting operation so as to generate a refresh row address, comparing the refresh row address with the address information, skipping the refresh of the weak cell row when the refresh row address and the weak cell row address coincide with each other as a result of comparison, and refreshing the weak cell row of the address information with the period that is shorter than the refresh period, where the weak cell row address of the address information may be set so as not to be refreshed with the refresh period.

The second receipt unit 1607 includes a second optical demodulator 1607A. The second optical demodulator 1607A converts a first optical receipt signal OPT1OC from the optical link 1601A into the first electric signal SN1 and transmits the signal to the memory area 1608.

The memory area 1608 writes the write data in the memory cell or transmits data read from the memory area 1608 to the second transmission unit 1609 as a second electric signal SN2 in response to the first electric signal SN1. The second electric signal SN2 may include the clocking signal and read data transmitted to the memory controller 1602. The second transmission unit 1609 includes the second optical modulator 1609B. The second optical modulator 1609B converts the second electric signal SN2 into the second optical data signal OPT2EC and transmits the signal to the optical link 1601B. The second optical transmission signal OTP2EC may be transmitted to the serial communication via the optical link 1601B.

Figure 17:
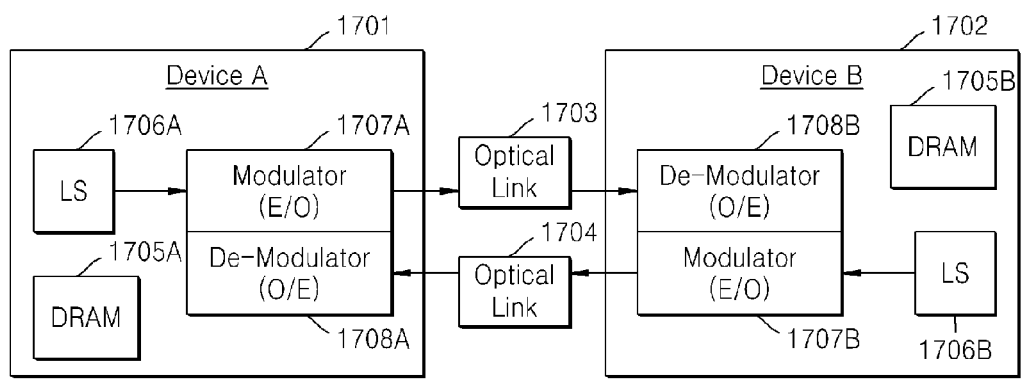
FIG. 17 is a block diagram of a data processing system including DRAM configured to perform a refresh method according to embodiments of the inventive concept.

FIG. 17 is a block diagram of a data processing system 1700 including DRAM configured to perform a refresh method according to embodiments of the inventive concept.

Referring to FIG. 17, the data processing system 1700 includes a first apparatus 1701, a second apparatus 1702, and a plurality of optical connection apparatuses or optical links 1703 and 1704. The first apparatus 1701 and the second apparatus 1702 may transmit/receive optical signals via serial communication.

The first apparatus 1701 includes DRAM 1705A, a first light source 1706A, a first optical modulator 1707A performing an electric to optical conversion operation, and a first optical demodulator 1708A performing an optical to electric conversion operation. The second apparatus 1702 includes DRAM 1705B, a second light source 1706B, a second optical modulator 1707B, and a first optical demodulator 1708B.

The refresh method of each of the DRAM 1705A and/or the DRAM 1705B may include storing address information about at least one weak cell row address that has to be refreshed according to a period that is shorter than a refresh period, performing a counting operation to generate a refresh row address, comparing the refresh row address with the address information, refreshing the weak cell row address when the refresh row address and the weak cell row address coincide with each other as a result of comparison, changing the weak cell row address by changing the pointer PR of the address information, and refreshing the changed weak cell row address with the period that is shorter than the refresh period.

The refresh method of each of the DRAM 1705A and/or the DRAM 1705B may include storing address information about at least one weak cell row address that has to be refreshed according to a period that is shorter than a refresh period, performing a counting operation to generate a refresh row address, comparing the refresh row address with the address information, skipping the refresh of the weak cell row when the refresh row address and the weak cell row address coincide with each other as a result of comparison, and refreshing the weak cell row of the address information with the period that is shorter than the refresh period, where the weak cell row address of the address information may be set so as not to be refreshed with the refresh period.

The first and second light sources 1706A and 1706B output optical signals having continuous waveforms. The first and second light sources 1706A and 1706B may use distributed feed-back laser diode (DFB-LD) that is a multi-wavelength source or a Fabry Perot laser diode (FP-LD) as a light source, for example.

The first optical modulator 1707A converts transmission data into an optical transmission signal and transmits the signal to the optical link 1703. The first optical modulator 1707A may modulate a wavelength of the optical signal transmitted from the first light source 1706A according to the transmission data. The first optical demodulator 1708A receives and demodulates the optical signal output from the second optical modulator 1707B of the second apparatus 1702 via the optical link 1704, and outputs the demodulated optical signal.

The second optical modulator 1707B converts the transmission data of the second apparatus 1702 into the optical transmission signal and transmits the signal to the optical link 1704. The second optical modulator 1707B may modulate a wavelength of the optical signal transmitted from the second light source 1706B according to the transmission data. The second optical demodulator 1708B receives and demodulates the optical signal output from the first optical modulator 1707A of the first apparatus 1701 via the optical link 1703, and outputs the demodulated signal.

Figure 18:
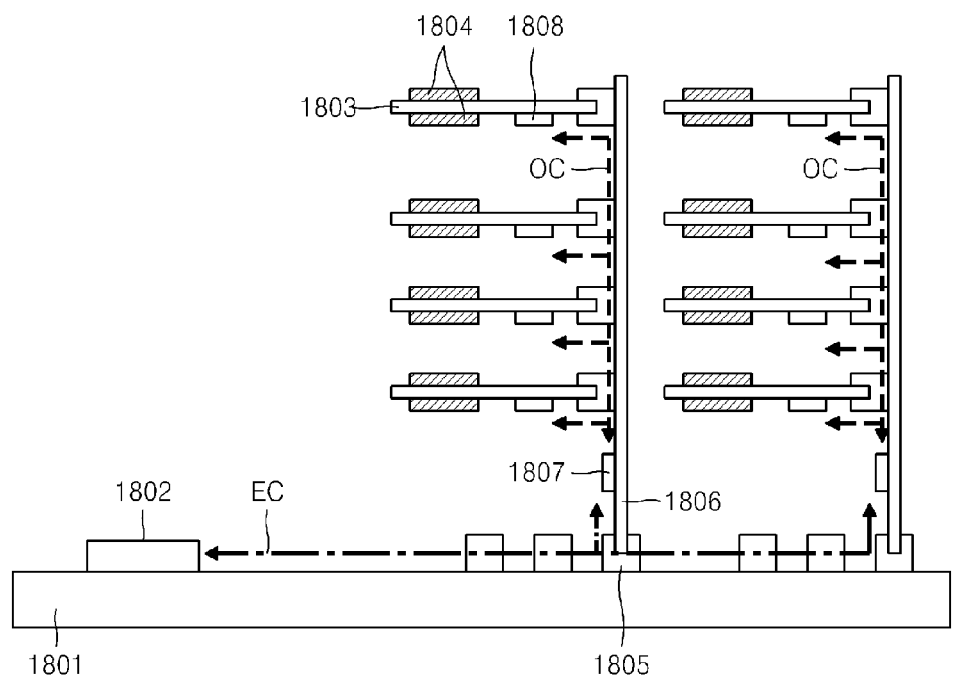
FIG. 18 is a diagram of a server system including DRAM configured to perform a refresh method, according to embodiments of the inventive concept.

FIG. 18 is a cross-sectional diagram of a server system 1800 including DRAM configured to perform a refresh method according to embodiments of the inventive concept.

Referring to FIG. 18, the server system 1800 includes a memory controller 1802 and a plurality of memory modules 1803. Each of the memory modules 1803 includes a plurality of DRAM chips 1804.

The refresh method of each of the DRAM chips 1804 may include storing address information about at least one weak cell row address that has to be refreshed according to a period that is shorter than a refresh period, performing a counting operation to generate a refresh row address, comparing the refresh row address with the address information, refreshing the weak cell row address when the refresh row address and the weak cell row address coincide with each other as a result of comparison, changing the weak cell row address by changing the pointer PR of the address information, and refreshing the changed weak cell row address with the period that is shorter than the refresh period.

The refresh method of each of the DRAM chips 1804 may include storing address information about at least one weak cell row address that has to be refreshed according to a period that is shorter than a refresh period, performing a counting operation so as to generate a refresh row address, comparing the refresh row address with the address information, skipping the refresh of the weak cell row when the refresh row address and the weak cell row address coincide with each other as a result of comparison, and refreshing the weak cell row of the address information with the period that is shorter than the refresh period, wherein the weak cell row address of the address information may be set so as not to be refreshed with the refresh period.

The server system 1800 may have a structure in which second circuit boards 1806 are coupled to sockets 1805 of a first circuit board 1801. The server system 1800 may design a channel structure, in which one second circuit board 1806 is connected to the first circuit board 1801 for each signal channel. However, the inventive concept is not limited thereto, and various structures may be designed.

In addition, the signal transfer between the memory modules 1803 may be performed through optical IO connection. For the optical IO connection, the server system 1800 may further include an electro-optic changing unit 1807, and each of the memory modules 1803 may further include a photo-electric changing unit 1808.

The memory controller 1802 is connected to the electro-optic changing unit 1807 via an electric channel EC. The electro-optic changing unit 1807 converts the electric signal transmitted from the memory controller 1802 via the electric channel EC into an optical signal and transfers the optical signal to an optical channel OC. Also, the electro-optic changing unit 1807 converts the optical signal transmitted through the optical channel OC into the electric signal, and transfers the electric signal to the electric channel EC.

The memory modules 1803 are connected to the electro-optic changing unit 1807 via the optical channel OC. The optical signal applied to the memory module 1803 may be converted into an electric signal via the electro-optic changing unit 1808, and then may be transferred to the DRAM chip(s) 1804. The server system 1800 including the above optical connection memory modules may have high storage capacity and fast processing speed.

Figure 19:
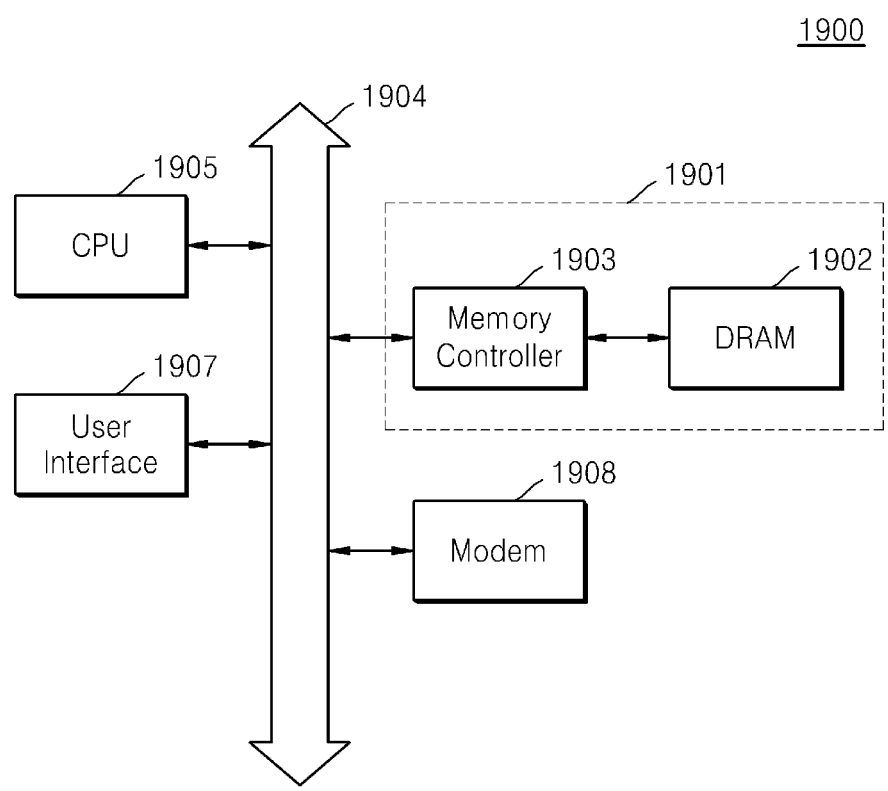
FIG. 19 is a block diagram of a computer system including a DRAM memory system, which provides DRAM configured to perform a refresh method according to embodiments of the inventive concept.

FIG. 19 is a block diagram of a computer system 1900 including a DRAM memory system 1901, which provides DRAM configured to perform a refresh method according to embodiments of the inventive concept.

Referring to FIG. 19, the computer system 1900 may be provided in a mobile device or a desk top computer, for example. The computer system 1900 includes a DRAM memory system 1901 electrically connected to a system bus 1904, a central processing unit (CPU) 1905, a user interface 1907, and a modem 1908 such as a baseband chipset. The computer system 1900 may further include an application chipset, a camera image processor (CIS), and an input/output device (not shown).

The user interface 1907 is configured to transfer data to a communication network and/or to receive data from the communication network. The user interface 1907 may be a wired type or a wireless type interface, and may include an antenna or a wired/wireless transceiver, for example. The data provided via the user interface 1907 or the modem 1908 or the data processed by the central processing unit 1905 may be stored in the DRAM memory system 1901.

The DRAM memory system 1901 includes DRAM 1902 and a memory controller 1903. The DRAM 1902 stores data processed by the central processing unit 1905 or data input from outside. The refresh method of the DRAM 1902 may include storing address information about at least one weak cell row address that has to be refreshed according to a period that is shorter than a refresh period, performing a counting operation to generate a refresh row address, comparing the refresh row address with the address information, refreshing the weak cell row address when the refresh row address and the weak cell row address coincide with each other as a result of comparison, changing the weak cell row address by changing the pointer PR of the address information, and refreshing the changed weak cell row address with the period that is shorter than the refresh period.

The refresh method of the DRAM 1902 may include storing address information about at least one weak cell row address that has to be refreshed according to a period that is shorter than a refresh period, performing a counting operation to generate a refresh row address, comparing the refresh row address with the address information, skipping the refresh of the weak cell row when the refresh row address and the weak cell row address coincide with each other as a result of comparison, and refreshing the weak cell row of the address information with the period that is shorter than the refresh period, where the weak cell row address of the address information may be set so as not to be refreshed with the refresh period.

When the computer system 1900 is a device for performing wireless communications, the computer system 1900 may be used in a communication system, such as code division multiple access (CDMA), global system for mobile communication (GSM), North American multiple access (NADC), and CDMA2000, for example. The computer system 1900 may be mounted in an information processing device, such as a personal digital assistant (PDA), a portable computer, a web tablet, a digital camera, a portable media player (PMP), a mobile phone, a wireless phone, and a laptop computer, for example.

A computer system generally includes a cache memory and a random access memory (RAM) having fast processing speed, and storage for storing large capacity data separately. However, the DRAM system according to embodiments of the inventive concept substitutes for these memories. That is, a computer system including the DRAM system according to embodiments of the inventive concept may rapidly store large capacity data, and the computer system may have a simple structure.

While the inventive concept has been described with reference to exemplary embodiments, it will be apparent to those skilled in the art that various changes and modifications may be made without departing from the spirit and scope of the present invention. Accordingly, all such modifications are intended to be included within the scope of the inventive concept. Therefore, it should be understood that the above embodiments are not limiting, but illustrative.

What is claimed is:

1. A method of refreshing a volatile memory, the method comprising:
    storing address information about a weak cell row address that is to be refreshed according to a weak cell refresh period that is shorter than a refresh period;
    performing a counting operation for generating a refresh row address;
    comparing the refresh row address with the address information;
    when a result of the comparison shows that the refresh row address and the weak cell row address of the address information coincide with each other, refreshing the weak cell row address;
    changing the weak cell row address by changing a pointer of the address information; and
    refreshing the changed weak cell row address according to the weak cell refresh period.

2. The method of claim 1, wherein performing the counting operation comprises:
    initializing the refresh row address;
    incrementally increasing the refresh row address; and
    initializing the refresh row address when the refresh row address is greater than a maximum row address.

3. The method of claim 2, wherein the refresh row address is initialized in response to a reset signal that is generated after finishing a power-up sequence of the volatile memory or finishing a power-down mode.

4. The method of claim 1, wherein performing the counting operation comprises:
    outputting the refresh row address;
    incrementally increasing the refresh row address; and
    initializing the refresh row address when the refresh row address is greater than a maximum row address.

5. The method of claim 1, wherein the weak cell row address of the address information is an address of a weak cell row including at least one cell having a data retention time that is shorter than the refresh period that is defined as a standard.

6. The method of claim 1, wherein the address information is stored in an address storing unit before packaging the volatile memory device.

7. The method of claim 1, wherein the address information is stored in an address storing unit after packaging the volatile memory device.

8. A method of refreshing a volatile memory, the refresh method comprising:
   storing address information about a weak cell row address that is to be refreshed according to a weak cell refresh period that is shorter than a refresh period;
   performing a counting operation for generating a refresh row address;
   comparing the refresh row address with the address information;
   when a result of the comparison shows that the refresh row address and the address information the weak cell row address coincide with each other, skipping a refresh of the weak cell row address; and
   refreshing the weak cell row address of the address information according to the weak cell refresh period.

9. The method of claim 8, wherein the weak cell row address of the address information is not refreshed with the refresh period.

10. The method of claim 8, wherein performing the counting operation comprises:
    initializing the refresh row address;
    incrementally increasing the refresh row address; and
    initializing the refresh row address when the refresh row address is greater than a maximum row address.

11. The method of claim 10, wherein the refresh row address is initialized in response to a reset signal that is generated after finishing a power-up sequence of the volatile memory or finishing a power-down mode.

12. The method of claim 8, wherein performing of the counting operation comprises:
    outputting the refresh row address;
    incrementally increasing the refresh row address; and
    initializing the refresh row address when the refresh row address is greater than a maximum row address.

13. The method of claim 8, wherein the weak cell row address of the address information is an address of a weak cell row including at least one cell having a data retention time that is shorter than the refresh period that is defined as a standard.

14. The method of claim 8, wherein the address information is stored in an address storing unit before packaging the volatile memory device.

15. The method of claim 8, wherein the address information is stored in an address storing unit after packaging the volatile memory device.

16. A volatile memory device, comprising:
    a memory cell array comprising a plurality of memory cell rows; and
    a refresh address generator configured to output refresh row addresses for identifying rows of the memory cell array to be refreshed according to a refresh period of a refresh operation, wherein the refresh address generator comprises:
       an address storing unit configured to store address information about a plurality of weak cell row addresses to be sequentially refreshed according to according to a weak cell refresh period of a refresh leveraging operation, each weak cell row including at least one cell having a data retention time shorter than the refresh period, and the weak cell refresh period being shorter than the refresh period;
       a refresh counter configured to incrementally increase a refresh row address;
       a comparing unit configured to compare the refresh row address output by the refresh counter with the address information read from the address storing unit, and to generate a match signal when the refresh row address coincides with a weak cell row address of the address information; and
       an address changing unit configured to receive the match signal from the comparing unit, and to generate an address change signal provided to the address storing unit, the address storing unit changing the weak cell row address of the address information, wherein the changed weak cell row address is refreshed according to the weak cell refresh period of the refresh leveraging operation.

17. The volatile memory device of claim 16, wherein the address storing unit is further configured to change the weak cell row address by increasing a pointer of the address information by one.

18. The volatile memory device of claim 17, further comprising:
    A control logic configured to control operation of the refresh address generator.

19. The volatile memory device of claim 18, wherein the control logic compares the refresh row address to a maximum row address of the plurality of memory cell rows included in the memory cell array, and when the refresh row address is not greater than the maximum row address, the refresh counter again increases the refresh row address by one.

20. The volatile memory device of claim 19, wherein when the refresh row address is greater than the maximum row address, the refresh counter resets the refresh row address to a first refresh row address.

* * * * *